United States Patent
Ocker et al.

(10) Patent No.: US 11,996,131 B2
(45) Date of Patent: May 28, 2024

(54) PRECONDITIONING OPERATION FOR A MEMORY CELL WITH A SPONTANEOUSLY-POLARIZABLE MEMORY ELEMENT

(71) Applicant: Ferroelectric Memory GmbH, Dresden (DE)

(72) Inventors: Johannes Ocker, Dresden (DE); Foroozan Koushan, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 111 days.

(21) Appl. No.: 17/568,158

(22) Filed: Jan. 4, 2022

(65) Prior Publication Data

US 2023/0215481 A1 Jul. 6, 2023

(51) Int. Cl.
*G11C 11/22* (2006.01)
*H10B 53/30* (2023.01)

(52) U.S. Cl.
CPC ........ *G11C 11/2275* (2013.01); *G11C 11/221* (2013.01); *H10B 53/30* (2023.02); *G11C 11/2273* (2013.01)

(58) Field of Classification Search
CPC .............. G11C 11/2275; G11C 11/221; G11C 11/2273; H10B 53/30
See application file for complete search history.

(56) References Cited

U.S. PATENT DOCUMENTS

| | | | | |
|---|---|---|---|---|
| 6,262,919 B1* | 7/2001 | Chou | ................... | G11C 29/027 |
| | | | | 365/201 |
| 9,368,162 B2* | 6/2016 | Priel | ........................ | G11C 5/14 |
| 11,475,935 B1* | 10/2022 | Ocker | ................... | G11C 11/221 |
| 2001/0044916 A1* | 11/2001 | Blodgett | .............. | G11C 29/808 |
| | | | | 714/711 |
| 2003/0169621 A1* | 9/2003 | Kawamura | ........... | G11C 16/28 |
| | | | | 365/185.03 |
| 2005/0248385 A1* | 11/2005 | Lee | ........................ | G11C 5/145 |
| | | | | 327/528 |
| 2021/0125656 A1* | 4/2021 | Müller | ................... | G11C 11/223 |

* cited by examiner

*Primary Examiner* — Khamdan N. Alrobaie
(74) *Attorney, Agent, or Firm* — Hickman Becker Bingham Ledesma LLP

(57) ABSTRACT

Various aspects relate to a method of manufacturing a memory cell, the method including: forming a memory cell, wherein the memory cell comprises a spontaneously-polarizable memory element, wherein the spontaneously-polarizable memory element is in an as formed condition; and carrying out a preconditioning operation of the spontaneously-polarizable memory element to bring the spontaneously-polarizable memory element from the as formed condition into an operable condition to allow for a writing of the memory cell after the preconditioning operation is carried out.

20 Claims, 11 Drawing Sheets

PRECONDITIONING OPERATION FOR A MEMORY CELL WITH A SPONTANEOUSLY-POLARIZABLE MEMORY ELEMENT

TECHNICAL FIELD

Various aspects relate to a memory cell, a memory device, and methods thereof, e.g., a method of providing a memory cell, and a method of providing a memory device.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing in. At present, various types of memory cells may be used to store data. By way of example, a type of memory cell may include a thin film of a spontaneous-polarizable material, e.g., a ferroelectric material or a configuration of an anti-ferroelectric material, whose polarization state may be changed in a controlled fashion to store data in the memory cell, e.g., in a non-volatile manner. A memory cell or an arrangement of memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
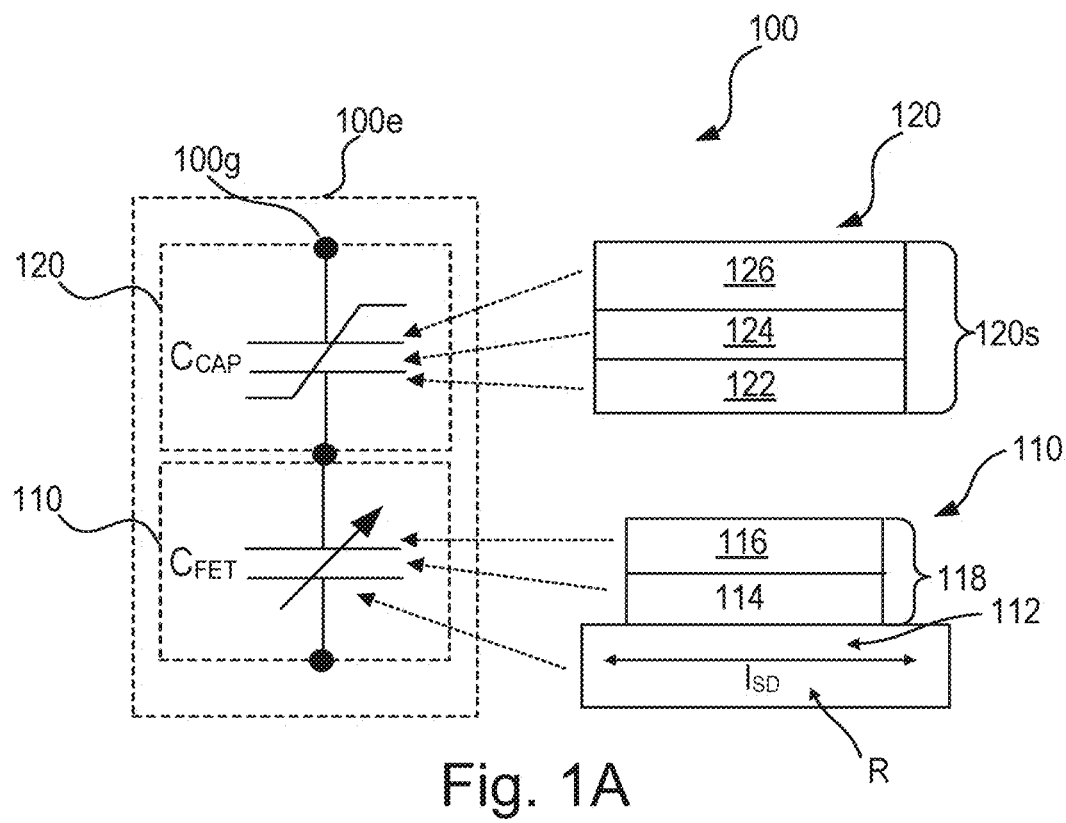
FIG. 1A and FIG. 1B show a memory structure in a schematic view according to various aspects.

The following detailed description refers to the accompanying drawings that show, by way of illustration, specific details, and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell, a memory device, or a memory cell arrangement). However, it may be understood that aspects described in connection with methods may similarly apply to the devices, and vice versa.

In memory technology, the switching behavior of a memory cell, illustratively the behavior of the memory cell when switching from one memory state to another memory state, plays an important role in defining its overall performance. The switching behavior should be reliable and remain reliable over time, e.g., over the lifetime of the memory cell, to ensure that a user can write data into the memory cell and read data from the memory cell without incurring in errors or malfunctions. In the context of a polarization-based memory cell, e.g., a memory cell including a spontaneously-polarizable memory element, the reliability of the switching behavior may be related to the polarization behavior of the memory cell, e.g., may be related to the reliability of the switching of the polarization state of the memory element and overall, to the polarization properties of the memory element.

As an example, in the case that a memory cell includes a ferroelectric memory element, a stable switching behavior of the memory cell may be provided via subjecting the memory cell to a wake-up cycle, which may include an electric field cycling that provides an increase in the remanent polarization of the ferroelectric memory element. However, the constant miniaturization efforts in the semiconductor industry pose challenges for the implementation of wake-up cycles for polarization-based memory cells. For example, the cell size reduction path in ferroelectric field-effect transistor (FeFET) technology may drive the FeFET coupling ratio to relatively large values (e.g., a coupling ratio greater than 0.5 as an example), making the wake-up process harder to achieve. In addition, the implementation of wake-up cycling and the miniaturization of memory cells drive write voltage requirements for cycling memory cells (e.g., FeFET-based memory cells) to higher values, thus increasing the complexity and the costs of memory devices.

Various aspects are based on the realization that a "preconditioning" step may be provided to a pristine memory cell to influence the polarization capabilities of a pristine spontaneously-polarizable memory element, to ensure stable polarization properties and to bring down voltage related requirements for the operation of the memory cell. The preconditioning may be carried out prior to the first use of the memory cell, for example prior to the first write operation carried out on the memory cell, to bring the memory cell into a (predefined) operable condition that ensures a stable and predictable behavior of the memory cell. A preconditioning operation as described herein may be configured to bring the spontaneously-polarizable memory element into an operable condition associated with one or more predefined polarization properties, so that a reproducible polarization behavior may be provided. A preconditioning operation may also be referred to herein as precondition operation, preconditioning process, preconditioning cycle, or simply as preconditioning.

Various aspects are based on the realization that providing a controlled operable condition of a memory cell rather than relying on the properties that the memory cell may have as formed may provide a more reliable and reproducible behavior of the memory cell, e.g., a more reliable and reproducible switching behavior of the polarization of the spontaneously-polarizable memory element. As an example, the preconditioning may be carried out immediately after forming the memory cell (e.g., on a semiconductor substrate, for example on a die), for example during sorting (and prior to any other operation after sorting), so that the memory cell may be brought into the operable condition prior to any further operation. Carrying out the preconditioning at sorting may provide delivering to a customer a memory cell being already in a (desired) operable condition, thus reducing the efforts for the customer. As another example, the preconditioning may be carried out prior to a first actual use of the memory cell, e.g., prior to storing any data into the memory cell (illustratively, prior to the first writing operation carried out on the memory cell).

The preconditioning described herein may ensure an increased uniformity in the properties of the memory cells (e.g., in the properties of a memory device including one or more memory cells). Illustratively, carrying out a preconditioning operation may provide bringing the memory cells into a (respective) operable condition, thus reducing the effects of fabrication-induced variations in the properties of the memory cells, e.g., in the properties of the respective spontaneously-polarizable memory element.

According to various aspects, the preconditioning may allow reducing the voltage to be used for operating the memory cell(s) (e.g., may allow reducing the voltage to be used for endurance-testing of the memory cell(s)). For example, the preconditioning may be carried out with different cycling conditions compared to a writing operation of the memory cell (e.g., different cycling conditions compared to endurance-testing), for example with an increased voltage provided at the memory cell to provide a reduction of the voltage (e.g., a $V_{PP}$ voltage, also referred to herein as $V_{DD}$ voltage) to be used for the (e.g., subsequent) operation, thus making the operation of the memory cell (and the endurance testing) more energy-efficient.

By way of illustration, the preconditioning may provide "fully waking-up" a memory cell. The preconditioning may provide, in some aspects, increasing the remanent polarization of a spontaneously-polarizable memory element (with respect to the as formed condition of the memory element), to provide a more reliable and durable switching behavior of the polarization and accordingly of a memory state the memory cell is residing in.

According to various aspects a method of manufacturing a memory cell may include: forming a memory cell, wherein the memory cell includes a spontaneously-polarizable memory element, wherein the spontaneously-polarizable memory element is in an as formed condition; and carrying out a preconditioning operation of the spontaneously-polarizable memory element to bring the spontaneously-polarizable memory element from the as formed condition into an operable condition to allow for a writing of the memory cell after the preconditioning operation is carried out (in other words, after the preconditioning operation has been carried out).

According to various aspects a method of manufacturing a memory device may include: forming one or more memory cells (e.g., on a semiconductor substrate), wherein each memory cell of the one or more memory cells includes a spontaneously-polarizable memory element, wherein each spontaneously-polarizable memory element is in an as formed condition; and carrying out a preconditioning operation of each spontaneously-polarizable memory element to bring each spontaneously-polarizable memory element from the as formed condition into an operable condition to allow for a writing of the one or more memory cells after the preconditioning operation is carried out.

According to various aspects a method of manufacturing one or more memory devices may include: providing a semiconductor substrate that includes one or more dies, each of the one or more dies including a plurality of memory cells, each of the one or more memory cells including a spontaneously-polarizable memory element, and preconditioning the plurality of memory cells of each of the one or more dies to bring each of the plurality of memory cells into an operable condition defined by a preconditioned state of the spontaneously-polarizable memory element of each of the plurality of memory cells; and packaging the one or more dies to provide one or more memory devices.

According to various aspects a method of manufacturing a memory cell may include: forming a memory cell, wherein the memory cell includes a spontaneously-polarizable memory element, wherein the spontaneously-polarizable memory element is in an as formed condition; and bringing a temperature of the memory cell at a preconditioning temperature greater than an operating temperature of the memory cell and/or providing a preconditioning voltage drop over the spontaneously-polarizable memory element, the preconditioning voltage drop being different from (e.g., greater than) a write voltage drop for writing the memory cell.

According to various aspects a memory device may include: one or more memory cells, wherein each memory cell of the one or more memory cells includes a spontaneously-polarizable memory element, wherein at least one memory cell of the one or more memory cells has undergone a preconditioning operation configured to bring the spontaneously-polarizable memory element of the at least one memory cell from an as formed condition into an operable condition to allow for a writing of the memory cell.

According to various aspects a memory device may include: one or more memory cells, wherein each memory cell of the one or more memory cells includes a spontaneously-polarizable memory element, wherein the spontaneously-polarizable memory element of at least one memory cell is in an as formed condition; and a control circuit (pre)configured to cause a preconditioning operation to bring the spontaneously-polarizable memory element of the at least one memory cell from the as formed condition into an operable condition to allow for a writing of the memory cell after the preconditioning operation is carried out. In various aspects, the control circuit may be (pre)configured to cause the preconditioning operation at or prior to a first use of the memory device (e.g., prior to a first writing operation of the at least one memory cell).

According to various aspects a memory device may include: one or more memory cells, wherein each memory cell of the one or more memory cells includes a spontaneously-polarizable memory element; and a control circuit configured to cause a preconditioning operation of each spontaneously-polarizable memory element of the one or more memory cells to bring each spontaneously-polarizable memory element from an as formed condition into an operable condition to allow for a writing of the memory cell, wherein to cause the preconditioning operation the control circuit is configured to: provide a preconditioning voltage drop over each spontaneously-polarizable memory element, the preconditioning voltage drop being different from (e.g., greater than) a write voltage drop for writing the one or more memory cells, and/or bring a temperature of the one or more memory cells at a preconditioning temperature greater than an operating temperature of the one or more memory cells.

The term "operable" may be used herein in relation to a condition or to one or more properties, e.g., of a memory cell or a spontaneously-polarizable memory element, to include, for example, a desired condition or a desired value for a particular property that provide a stable operation of a memory cell. As an example, an operable condition of a memory cell may be a condition in which the memory cell may provide better performances (e.g., in terms of failures associated with the operation of the memory cell), e.g., may provide a reliable writing operation. As another example, a spontaneously-polarizable memory element being in an operable condition may have predefined properties or a predefined value of a particular property (e.g., a predefined remanent polarization, a predefined memory window, and/or the like) to provide better performances with respect to a spontaneously-polarizable memory element having non-predefined properties or a non-predefined value of a particular property. It is understood that a memory cell or a spontaneously-polarizable memory element, for example, may have more than one operable condition. For example, a memory cell or a spontaneously-polarizable memory element may have a plurality of operable conditions that ensure in a same or similar manner better performances with respect to other non-predefined conditions.

The term "as formed" may be used herein in relation to a condition or to one or more properties, e.g., of a memory cell or a spontaneously-polarizable memory element, to include, for example, a condition or property being present (immediately) after forming the memory cell or after forming the spontaneously-polarizable memory element. Illustratively, an as formed condition or property may describe a memory cell or spontaneously-polarizable memory element as it/they come(s) out of a fabrication process (e.g., layer deposition and patterning). An as formed property and/or an as formed value of a property may be different from a property and/or from a value of a property in an operable condition. An as formed condition or property may describe a memory cell or spontaneously-polarizable memory element prior to any intentional adaptation of the properties (e.g., of the polarization properties) of the memory cell or spontaneously-polarizable memory element, e.g., prior to subjecting the memory cell or spontaneously-polarizable memory element to any cycling operation (e.g., wake-up, endurance, writing, etc.). An as formed condition may also be referred to herein as pristine condition or virgin condition. An as formed property may also be referred to herein as pristine property or virgin property. Illustratively a "pristine memory cell" or a "pristine memory element" may describe a memory cell or memory element prior to any operation, e.g., prior to endurance testing, prior to writing, prior to readout, etc. A "pristine memory cell" or a "pristine memory element" may describe a memory cell or memory element as coming out from the fabrication process.

Figure 1B:
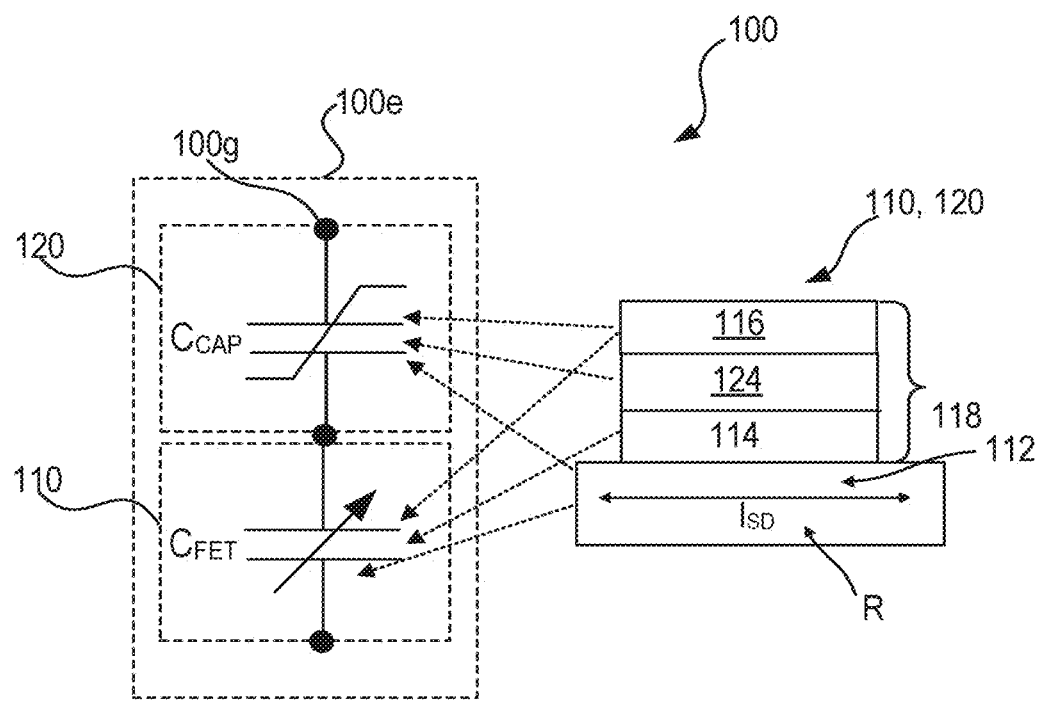

FIG. 1A and FIG. 1B show respectively various aspects of a memory structure 100. The memory structure 100 may be a field-effect transistor (FET)-based capacitive memory structure, according to various aspects. The memory structure 100 may include a field-effect transistor structure 110 and a capacitive memory structure 120. In some aspects, the capacitive memory structure 120 may be coupled to the field-effect transistor structure 110, see FIG. 1A, or the capacitive memory structure 120 may be, in other aspects, integrated into the field-effect transistor structure 110, see FIG. 1B. Basically, the memory structure 100 may include a field-effect transistor structure and a memory element (e.g., a spontaneously-polarizable memory element, such as a spontaneously-polarizable memory layer).

As illustrated in FIG. 1A, the capacitive memory structure 120 may include at least two electrodes 122, 126 (e.g., two electrode layers) and a memory element 124 coupled to the at least two electrodes 122, 126. The memory element 124 may include or may be a functional layer disposed between two electrodes 122, 126. A functional layer may also be referred to herein as memory layer. The memory element 124 may include or may consist of any type of suitable memory material, as for example a spontaneously-polarizable material. In some aspects, the memory element 124 may be in direct physical contact with the at least two electrodes, e.g., with first electrode 122 and with the second electrode 126. Illustratively, a first (shared) interface region may be present between the memory element 124 and the first electrode 122, and a second (shared) interface region may be present between the memory element 124 and the second electrode 126.

According to various aspects, the memory element 124 may be a capacitive memory element including, for example, an electrically non-conductive material such as a spontaneously-polarizable material. The capacitive memory structure 120 in a capacitive configuration may have a (first) capacitance, $C_{CAP}$, associated therewith (see equivalent circuit 100e with respect to the capacitive properties). The two electrodes 122, 126 and the memory element 124 may form a memory layer stack 120s. In some aspects, the memory layer stack 120s may be a planar layer stack; however, other shapes may be suitable as well, e.g., curved shapes, angled shapes, coaxially aligned shapes, as examples. Illustratively, the capacitive memory structure 120 may include planar electrodes 122, 126, or, in other aspects, the capacitive memory structure 120 may be configured as 3D capacitor including, for example, angled or curved electrodes 122, 126.

The field-effect transistor structure 110 may include a gate structure 118, wherein the gate structure 118 may include a gate isolation 114 and a gate electrode 116. The gate structure 118 is illustrated exemplarily as a planar gate stack; however, it is understood that the planar configuration shown in FIG. 1A and FIG. 1B is an example, and other field-effect transistor designs may include a gate structure 118 with a non-planar shape, for example a trench gate transistor design, a vertical field-effect transistor design, or other designs, such as a fin-FET design.

The gate structure 118 may define a channel region 112, e.g., provided in a semiconductor portion (e.g., in a semiconductor layer, in a semiconductor die, etc.). The gate structure 118 may allow for a control of an electrical behavior (e.g., a resistance R) of the channel region 112, e.g., a current flow in the channel region 112 may be controlled (e.g., allowed, increased, prevented, decreased, etc.). In some aspects, the gate structure 118 may, for example, allow to control (e.g., allow or prevent) a source/drain current, $I_{SD}$, from a first source/drain region of the field-effect transistor structure 110 to a second source/drain region of the field-effect transistor structure 110 (the source/drains are provided in or adjacent to the channel but are not shown in FIG. 1A and FIG. 1B). The channel region 112 and the source/drain regions may be formed, e.g., via doping one or more semiconductor materials or by the use of intrinsically doped semiconductor materials, within a layer and/or over a layer. With respect to the operation of the field-effect transistor structure 110, a voltage may be provided at the gate electrode 116 to control the current flow, $I_{SD}$, in the channel region 112, the current flow, $I_{SD}$, in the channel region 112 being caused by voltages supplied via the source/drain regions.

According to various aspects, the semiconductor portion (illustratively, where the channel region 112 may be formed), may be made of or may include silicon. However, other semiconductor materials of various types may be used in a similar way, e.g., germanium, Group III to V (e.g., SiC), or other types, including for example carbon nanotubes, organic materials (e.g., organic polymers), etc. In various aspects, the semiconductor portion may be a wafer made of silicon (e.g., p-type doped or n-type doped). In other aspects, the semiconductor portion may be a silicon on insulator (SOI) wafer. In other aspects, the semiconductor portion may be provided by a semiconductor structure, e.g., by one or more semiconductor fins, one or more semiconductor nanosheets, one or more semiconductor nanowires, etc., disposed at a carrier.

The gate electrode 116 may include an electrically conductive material, for example, a metal, a metal alloy, a degenerate semiconductor (in other words a semiconductor material having such a high level of doping that the material acts like a metal and not anymore as a semiconductor), and/or the like. As an example, the gate electrode 116 may include or may be made of aluminum. As another example, the gate electrode 116 may include or may be made of polysilicon. According to various aspects, the gate electrode 116 may include one or more electrically conductive portions, layers, etc. The gate electrode 116 may include, for example, one or more metal layers (also referred to as a metal gate), one or more polysilicon layers (also referred to as poly-Si-gate), etc. A metal gate may include, for example, at least one work-function adaption metal layer disposed over the gate isolation 114 and an additional metal layer disposed over the work-function adaption metal layer. A poly-Si-gate may be, for example, p-type doped or n-type doped.

The gate isolation 114 may be configured to provide an electrical separation of the gate electrode 116 from the channel region 112 and further to influence the channel region 112 via an electric field generated by the gate electrode 116. The gate isolation 114 may include one or more electrically insulating layers, as an example. Some designs of the gate isolation 114 may include at least two layers including different materials, e.g., a first gate isolation layer (e.g., a first dielectric layer including a first dielectric material) and a second gate isolation layer (e.g., a second dielectric layer including a second dielectric material distinct from the first dielectric material).

As illustrated by the circuit equivalent in FIGS. 1A and 1B, a (second) capacitance, $C_{FET}$, may be associated with the field-effect transistor structure 110. Illustratively, the channel region 112, the gate isolation 114, and the gate electrode 116 may have a capacitance, $C_{FET}$, associated therewith, originating from the more or less conductive regions (the channel region 112 and the gate electrode 116) separated from one another by the gate isolation 114. Further illustratively, the channel region 112 may be considered as a first capacitor electrode, the gate electrode 116 as a second capacitor electrode, and the gate isolation 114 as a dielectric medium between the two capacitor electrodes. The capacitance, $C_{FET}$, of the field-effect transistor structure 110 may define one or more operating properties of the field-effect transistor structure 110. The configuration of the field-effect transistor structure 110 (e.g., of the gate isolation 114) may be adapted according to a desired behavior or application of the field-effect transistor structure 110 during operation (e.g., according to a desired capacitance).

In general, the capacitance, C, of a planar capacitor structure may be expressed as, $$C = \varepsilon_0 \varepsilon_r \frac{A}{d},$$

with $\varepsilon_0$ being the relative permittivity of the vacuum, A being the effective area of the capacitor, d being the distance of the two capacitor electrodes from one another, and $\varepsilon_r$ being the relative permittivity of the dielectric material disposed between two capacitor electrodes assuming that the whole gap between the two capacitor electrodes is filled with the dielectric material. It is noted that the capacitance of a non-planar capacitor structure or of a modified variant of a planar capacitor structure may be calculated based on equations known in the art.

In some aspects, the gate electrode 116 of the field-effect transistor structure 110 and the electrode 122 of the capacitive memory structure 120 that is connected to the field-effect transistor structure 110 may be spatially separated from one another and electrically connected via a conductive connection, e.g., one or more metal lines. In other aspects, the gate electrode 116 of the field-effect transistor structure 110 and one of the at least two electrodes 122, 126 of the capacitive memory structure 120 may be in direct physical contact with one another or implemented as a single (shared) electrode.

In other aspects, the capacitive memory structure 120 may be integrated in the field-effect transistor structure 110, as illustrated in FIG. 1B. In this case, the memory element 124 may be integrated in the gate structure 118 of the field-effect transistor structure 110, and a capacitive memory structure 120 is formed by the memory element 124 disposed between the channel region 112 and the gate electrode 116 in a similar way (cf. equivalent circuits 100e in FIG. 1A and FIG. 1B) as described with reference to FIG. 1A.

The field-effect transistor structure 110 and the capacitive memory structure 120 form together a field-effect transistor based (e.g., capacitive) memory structure, as exemplarily shown in FIGS. 1A and 1B. A gate 100g of the field-effect transistor based (e.g., capacitive) memory structure may be provided by the gate electrode 116 (see FIG. 1B) or, in other configurations, by an electrode 126 of the capacitive memory structure 120 (see FIG. 1A). In the configuration in FIG. 1B, the field-effect transistor structure 110 may illustratively include a channel 112, and a gate stack 118 disposed adjacent to the channel 112, wherein the gate stack 112 includes a memory element 124 as gate isolation disposed between the channel 112 and the gate electrode 116.

According to various aspects, the memory structure 100 may provide or may be part of a memory cell. A memory cell may be provided, for example, by coupling a gate of a field-effect transistor structure with a capacitive memory structure, or by integrating a memory structure in the gate structure of a field-effect transistor structure (as shown, in FIGS. 1A and 1B for the field-effect transistor structure 110 and the capacitive memory structure 120). A memory cell may illustratively include a field-effect transistor structure and a capacitive memory structure coupled to or integrated in the field-effect transistor structure (optionally with one or more additional elements). In such a configuration the functional layer (e.g., a capacitive memory element) may be in a capacitive environment, e.g., disposed between two electrode layers or disposed between a channel of a field-effect transistor and an electrode layer (e.g., a gate electrode of the field-effect transistor). In such a memory cell, the state (e.g., the polarization state) of the memory element influences the threshold voltage of the field-effect transistor structure (e.g., a first state of the memory element may be associated with a first threshold voltage, such as a low threshold voltage, and a second state of the memory element may be associated with a second threshold voltage, such as a high threshold voltage). A memory cell that includes a field-effect transistor structure and a capacitive memory structure may be referred to as field-effect transistor based memory cell or field-effect transistor based capacitive memory cell. It is noted that even though various aspects of a memory cell are described herein with reference to a field-effect transistor based capacitive memory structure (such as a FeFET), other memory structures may be suitable as well.

The field-effect transistor structure 110 and the capacitive memory structure 120 may be coupled (e.g., electrically connected) to one another such that a capacitive voltage divider is provided. The capacitive voltage divider formed by the field-effect transistor structure 110 and the capacitive memory structure 120 may allow adapting the capacitances $C_{FET}$, $C_{CAP}$ of the respective capacitors to allow an efficient programming of the memory cell. The overall gate voltage required for switching the memory cell from one memory state into another memory state (e.g., from high threshold voltage state to low threshold voltage state, as described below), may become smaller in case the voltage distribution across the field-effect transistor structure 110 and the capacitive memory structure 120 is adapted such that more of the applied gate voltage drops across the memory layer of the capacitive memory structure 120 (e.g., across the memory element 124) than across the gate isolation of the field-effect transistor structure 110. The overall write voltage (illustratively, applied via nodes to which the field-effect transistor structure 110 and the capacitive memory structure 120 are connected) may thus be reduced by adapting the capacitive voltage divider. The voltage distribution may be determined by voltage divider calculations for a series connection of the capacitors.

That is, in the case that the capacitance, $C_{FET}$, of the field-effect transistor structure 110 is adapted (e.g., by providing a suitable gate isolation) a predefined fraction of the voltage applied to the series connection may drop across the capacitive memory structure 120. Accordingly, the electric field generated across the gate isolation of the field-effect transistor structure 110 underneath the capacitive memory structure 120 could be reduced if desired. This may lead to a reduced interfacial field stress, which may lead to a reduced wear out of the interface due to, for example, charge injection. Therefore, the reduced electric field generated across the gate isolation may lead to improved endurance characteristics of the memory cell, that is, to an increased amount of possible state reversals until the memory cell may lose or change its memory properties.

In some aspects, the memory element 124 of the capacitive memory structure 120 may include (e.g., may consist of) a remanent-polarizable layer. By increasing the capacitance $C_{FET}$ of the field-effect transistor structure 110 (e.g., by providing a gate isolation including a relatively thick layer of material with high dielectric constant), the depolarization field, $E_{Dep}$, of the remanent-polarizable layer may be reduced. The depolarization field, $E_{Dep}$, may be detrimental to data retention since, depending on its magnitude, it may depolarize the remanent-polarizable layer. However, the magnitude may be reduced by increasing the capacitance ratio $C_{FET}/C_{CAP}$. Accordingly, in case the capacitance $C_{FET}$ of the field-effect transistor structure 110 is increased, the depolarization field is reduced. This in turn improves the data retention of the memory cell. The capacitance ratio $C_{FET}/C_{CAP}$ may also be referred to herein as coupling ratio.

According to various aspects, a threshold voltage of a field-effect transistor structure (and in a corresponding manner the threshold voltage of a field-effect transistor based memory cell) may be defined as a constant current threshold voltage (referred to as $V_{th}(ci)$). In this case, the constant current threshold voltage, $V_{th}(ci)$, may be a determined gate source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g., 0.1 µA. In some aspects, the constant current threshold voltage, $V_{th}(ci)$, may be determined based on the following equation:

$$V_{th}(ci) = V_{GS}(\text{at } I_D = I_{D0} \cdot W/L).$$

A threshold voltage of a field-effect transistor structure (e.g., of the field-effect transistor structure 110) may be defined by the properties of the field-effect transistor structure (e.g., the materials, the doping, etc.), and it may thus be a (e.g., intrinsic) property of the field-effect transistor structure.

According to various aspects, a memory cell may have at least two distinct memory states associated therewith, for example with two distinct electrical conductivities or two distinct amounts of stored charge that may be determined to determine in which of the at least two distinct states the memory cell is residing in. A memory cell including a field-effect transistor structure may include a first memory state, for example associated with a low threshold voltage state (referred to as LVT associated with the LVT memory state), and a second memory state, for example associated with a high threshold voltage state (referred to as HVT state associated with the HVT memory state). The high threshold voltage state may be, in some aspects, associated with a lower current flow during readout than the low threshold voltage state. The low threshold voltage state may be an electrically conducting state (e.g., associated with a logic memory state "1", also referred to as a memory state or programmed state) and the high threshold voltage state may be an electrically non conducting state or at least less conducting than the low threshold voltage state (e.g., associated with a logic memory state "0", also referred to as a memory state or erased state). However, the definition of the LVT state and the HVT state and/or the definition of a logic "0" and a logic "1" and/or the definition of "programmed state" and "erased state" may be selected arbitrarily. Illustratively, the first memory state may be associated with a first threshold voltage of the FET based memory cell, and the second memory state may be associated with a second threshold voltage of the FET based memory cell.

According to various aspects, the remanent polarization of the memory element (e.g., the remanent polarization of a spontaneously-polarizable layer) may define the memory state a memory cell is residing in. According to various aspects, a memory cell may reside in a first memory state in the case that the memory element is in a first polarization state, and the memory cell may reside in a second memory state in the case that the memory element is in a second polarization state (e.g., opposite to the first polarization state, illustratively with the polarization pointing into an opposite direction). As an example, the polarization state of the memory element may determine the amount of charge stored in the capacitive memory structure. The amount of charge stored in the capacitive memory structure may be used to define a memory state of the memory cell. The threshold voltage of a field-effect transistor structure may be a function of the polarization state of the memory element, e.g., may be a function of the amount and/or polarity of charge stored in the capacitive memory structure. A first threshold voltage, e.g., a low threshold voltage $V_{L-th}$, may be associated with the first polarization state (e.g., with the first amount and/or polarity of stored charge), and a second threshold voltage, e.g., a high threshold voltage $V_{H-th}$, may be associated with the second polarization state (e.g., with the second amount and/or polarity of stored charge). A current flow from nodes to which the field-effect transistor structure and the capacitive memory structure are coupled may be used to determine the memory state in which the memory cell is residing in. As an example, the first polarization state may include a positive polarization, and the second polarization state may include a negative polarization.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing an n-type FET based memory cell may modify the state the memory cell is residing in from the LVT state to the HVT state, whereas erasing a p-type FET based memory cell may modify the state the memory cell is residing in from the HVT state to the LVT state.

According to various aspects, a memory element of a memory cell (e.g., the memory element of a capacitive memory structure coupled to or integrated in a field-effect transistor structure, for example the memory element 124) may include or may be made of a polarizable material, e.g., a spontaneously-polarizable material. A spontaneously-polarizable memory element (e.g., a spontaneously-polarizable layer) may show a hysteresis in the (voltage dependent) polarization. The spontaneously-polarizable memory element may show non-remanent spontaneous polarization (e.g., may show anti-ferroelectric properties), e.g., the spontaneously-polarizable memory element may have no or no substantial remanent polarization remaining in the case that no voltage drops over the spontaneously-polarizable memory element. In other aspects, the spontaneously-polarizable memory element may show remanent spontaneous polarization (e.g., may show ferroelectric properties), e.g., the spontaneously-polarizable memory element may have a remanent polarization or a substantial remanent polarization remaining in the case that no voltage drops over the spontaneously-polarizable memory element.

The terms "spontaneously polarized" or "spontaneous polarization" may be used herein, for example, with reference to the polarization capability of a material beyond dielectric polarization. A "spontaneously-polarizable" (or "spontaneous-polarizable") material may be or may include a spontaneously-polarizable material that shows a remanence, e.g., a ferroelectric material, and/or a spontaneously-polarizable material that shows no remanence, e.g., an anti-ferroelectric material. The coercivity of a material may be a measure of the strength of the reverse polarizing electric field that may be required to remove a remanent polarization.

A spontaneous polarization (e.g., a remanent or non-remanent spontaneous polarization) may be evaluated via analyzing one or more hysteresis measurements (e.g., hysteresis curves), e.g., in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, e.g., via a static (C-V) and/or time-resolved measurement or by polarization-voltage (P-V) or positive-up-negative-down (PUND) measurements.

According to various aspects, in various types of applications, e.g., in memory technology, a remanent polarization as low as 0 $\mu C/cm^2$ to 3 $\mu C/cm^2$ may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than 3 $\mu C/cm^2$ may be regarded as substantial remanent polarization. Such a substantial remanent polarization may allow for storing information as a function of a polarization state of a spontaneously-polarizable layer or a spontaneously-polarizable material.

In general, a remanent polarization (also referred to as retentivity, remanence, or residual polarization) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the remanent polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials. According to various aspects, an electric coercive field, $E_C$, (also referred to as coercive field) may be or represent the electric field required to depolarize a remanent-polarizable layer.

According to various aspects, a spontaneously-polarizable memory element may include or may consist of a remanent-polarizable material. A remanent-polarizable material may be a material that is remanently polarizable and shows a remanence of the spontaneous polarization, such as a ferroelectric material. In other aspects, a remanent-polarizable material may be a material that is spontaneously-polarizable and that shows no remanence, e.g., an anti-ferroelectric material under the additional conditions that measures are implemented to generate an internal electric-field within the anti-ferroelectric material. An internal electric-field within an anti-ferroelectric material may be caused (e.g., applied, generated, maintained, as examples) by various strategies: e.g., by implementing floating nodes that may be charged to voltages different from zero volts, and/or by implementing charge storage layers, and/or by using doped layers, and/or by using electrode layers that adapt electronic work-functions to generate an internal electric field, only as examples. A spontaneously-polarizable memory element including or being made of a remanent-polarizable material may be referred to herein as remanent-polarizable memory element (e.g., as remanent-polarizable layer).

In some aspects, a spontaneous-polarizable material (e.g., a remanent-polarizable material) may be based on at least one metal oxide. Illustratively, a composition of the spontaneous-polarizable material may include the at least one metal oxide for more than 50%, or more than 66%, or more than 75%, or more than 90%. In some aspects, the spontaneous-polarizable material may include one or more metal oxides. The spontaneous-polarizable material may include (or may be based on) at least one of $Hf_aO_b$, $Zr_aO_b$, $Si_aO_b$, $Y_aO_b$, as examples, wherein the subscripts "a" and "b" may indicate the number of the respective atom in the spontaneous-polarizable material.

In some aspects, the spontaneous-polarizable material (e.g., the remanent-polarizable material) may be or may include a ferroelectric material, illustratively a memory element may be ferroelectric memory element (for example a ferroelectric layer). A ferroelectric material may be an example of a material used in a spontaneously-polarizable memory element (e.g., in a remanent-polarizable element). The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to it, a 1:1 mixture) or hafnium oxide and/or zirconium oxide doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example.

According to various aspects, a capacitive memory structure (e.g., the capacitive memory structure 120) may be or may include a ferroelectric capacitor (FeCAP) or an anti-ferroelectric capacitor (AFeCAP); or, in other aspects, a capacitive memory structure may include a ferroelectric capacitor or an anti-ferroelectric capacitor (AFeCAP), and one or more additional elements. According to various aspects, a capacitive memory structure may include a capacitive memory element, e.g., a ferroelectric layer, e.g., an anti-ferroelectric layer. Illustratively, a memory element of a memory structure (e.g., the memory element 124 of the memory structure 100) may include any type of spontaneously-polarizable material, e.g., a ferroelectric material, an anti-ferroelectric material, an anti-ferroelectric-like material, etc. An information may be stored via at least two remanent polarization states of the capacitive memory structure. The programming of the capacitive memory structure (illustratively the storage of information therein) may be carried out by providing an electric field between the electrode layers to thereby set or change the remanent polarization state of the capacitive memory structure (illustratively, of the memory element). Illustratively, a spontaneous-polarizable material (e.g., a ferroelectric material, e.g., an anti-ferroelectric material) may be used to store data in non-volatile manner in integrated circuits.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. According to various aspects, a non-volatile field-effect transistor based memory structure or memory cell may store data for a period of time from hours (e.g., more than 5 hours) to several tens of years (e.g., 10 years, 20 years, etc.), whereas a volatile field-effect transistor based memory structure or memory cell may store data for a period of time from nanoseconds to hours (e.g., less than 5 hours).

In comparison to other emerging memory technologies, a FeFET memory cell or a FeFET based memory cell may be integrated in the Front-End-of-Line (FEoL) and/or in the Back-End-of-Line (BEoL) process flow, since it may be implemented as a transistor-type of memory. Accordingly, the integration of the FeFET memory cell or a FeFET based memory cell may comply with a standard FEoL and/or BEoL complementary metal-oxide-semiconductor (CMOS) process flow. Consequently, various integration schemes may be used to integrate a FeFET or a FeFET based memory cell in different process technologies, e.g., gate-first technologies, gate-last technologies, fully-depleted silicon-on-insulator (FDSOI) technologies, Fin-FET technologies, nanosheet technologies, nanowire technologies, as examples.

It may be understood that, even though various aspects refer to a memory element including or being made of a spontaneously-polarizable material, other memory elements whose state may be altered by an electric field provided across a capacitive memory structure may be used.

According to various aspects, a memory device may include one or more memory cells and a control circuit (also referred to herein as memory controller) to cause an operation of the one or more memory cells (e.g., a write operation and a readout operation). It is noted that some aspects are described herein with reference to a memory cell of a memory device; it is understood that a memory device may include a plurality of such described memory cells that can be operated in the same way by the memory controller, e.g., at the same time or in a time sequence. A memory device may further include respective sets of control lines and voltage supply levels configured to operate the one or more memory cells of the memory device.

In some aspects, a memory device may be or may include a memory cell arrangement, e.g., an array including a plurality of memory cells. A memory device may be operated based on one or more write operations (e.g., program and/or erase operations) and/or one or more readout operations. During a write operation, as example, predefined voltages may be provided to electrical lines (also referred to as control-lines or driver-lines), wherein the electrical lines may be connected to the respective nodes of the memory cells to allow for the desired operation. The electrical lines may be referred to, for example, as word-lines, source-lines, and/or bit-lines. One approach to program and/or erase a plurality of memory cells may be a one-third (⅓) voltage scheme. Such a ⅓ voltage scheme may realize that one-third of a programming voltage (the programming voltage may be also referred to as write voltage) is only substantially exceeded at nodes corresponding to one or more memory cells that are intended to be programmed or erased. All memory cells that are not intended to be written may see a voltage that is at least substantially equal to or less than one-third of the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages. A write operation may also be referred to herein as writing operation.

It is noted that a memory cell arrangement may usually be configured in a matrix-type arrangement, wherein columns and rows define the addressing of the memory cells according to the control lines connecting respectively subsets of memory cells of the memory cell arrangement along the rows and columns of the matrix-type arrangement. In general, a memory cell arrangement may include a plurality of (e.g., volatile, or non-volatile) memory cells, which may be accessed individually or in blocks, depending on the layout of the memory cell arrangement and/or the corresponding addressing scheme. For example, in a field-effect transistor (FET) based memory cell arrangement, the memory cells may be arranged in a matrix architecture (A(n,m)) including columns, for example a number n of columns, and rows, for example a number m of rows, with n and m being integer numbers greater than one. In the matrix architecture, each memory cell may be connected to control-lines (e.g., to one or more word-lines, to a bit-line, and to a source-line), which may be used to supply voltages to the memory cells for performing writing operations and readout operations. The matrix architecture may be, for example, referred to as "NOR" or "NAND" architecture, depending on the way neighboring memory cells are connected to each other, i.e., depending on the way the terminals of neighboring memory cells are shared, but are not limited to these two types (another type is for example an "AND" architecture). However, other arrangements may be suitable as well.

The memory cell or the memory device described herein may be used in connection with any type of suitable memory controller, e.g., a memory controller that may generate only two or only three different voltage levels for writing the memory cell (e.g., for writing one or more memory cells of a memory device). However, in other aspects, more than four different voltage levels may be used for operating (e.g., for reading) the memory cell or for operating one or more memory cells of a memory device.

According to various aspects, the memory cell and the memory device described herein may be configured to be complementary metal oxide semiconductor (CMOS) compatible, e.g., including standard CMOS-materials only and may require no special integration considerations (e.g., no special thermal budget which may avoid diffusion and/or contamination during manufacturing). CMOS compatible spontaneously-polarizable materials may be used to implement the one or more memory cell based on, for example, $HfO_2$ and/or $ZrO_2$. Doped $HfO_2$ (e.g., $Si:HfO_2$ or $Al:HfO_2$) or other suitable spontaneously-polarizable materials may allow for an integration of the spontaneously-polarizable layer via known integration schemes.

According to various aspects, a memory controller may be configured to provide one or more sets of voltage levels to operate a memory device. According to various aspects, a writing operation may be provided based on only two voltage levels (e.g., a first supply voltage level $V_{PP}$ and a second supply voltage level $V_{NN}$). In the case that the CMOS technology provides electrical access to the bulk, all bulks may be connected to $V_{NN}$ or a voltage significantly similar to $V_{NN}$ but such that no diode from bulk to any source/drain region is forward biased.

Various aspects may be based on the realization that even the most optimized spontaneously-polarizable material (e.g., even the most optimized ferroelectric material) should still undergo a wake-up cycle to provide polarization switching capabilities that ensure a long-term stable operation of a memory cell. In this context, in view of the ever increasing miniaturization requirements in memory technology and the correspondingly greater coupling ratios, wake-up cycles become harder and harder to implement. All this may lead to increased voltage-requirements for writing a memory cell (e.g., to greater voltage values for programming or erasing a memory cell). Some of the issues related to the operation of a memory cell are illustrated in FIG. 2A and FIG. 2B.

Figure 2A:
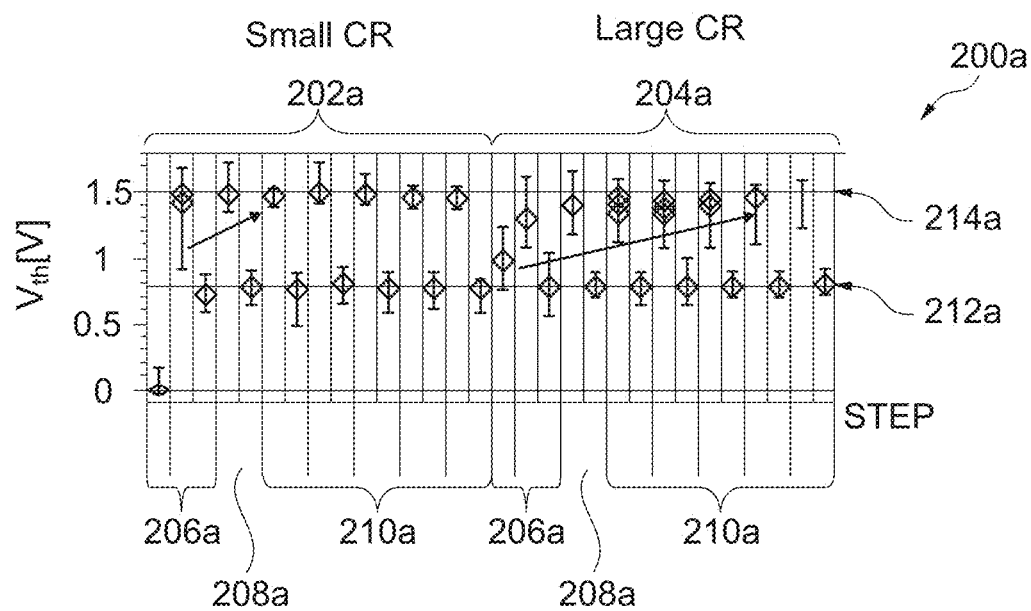
FIG. 2A and FIG. 2B show the impact of device-to-device variation on wake-up characteristics of memory cells according to various aspects.
Figure 2B:
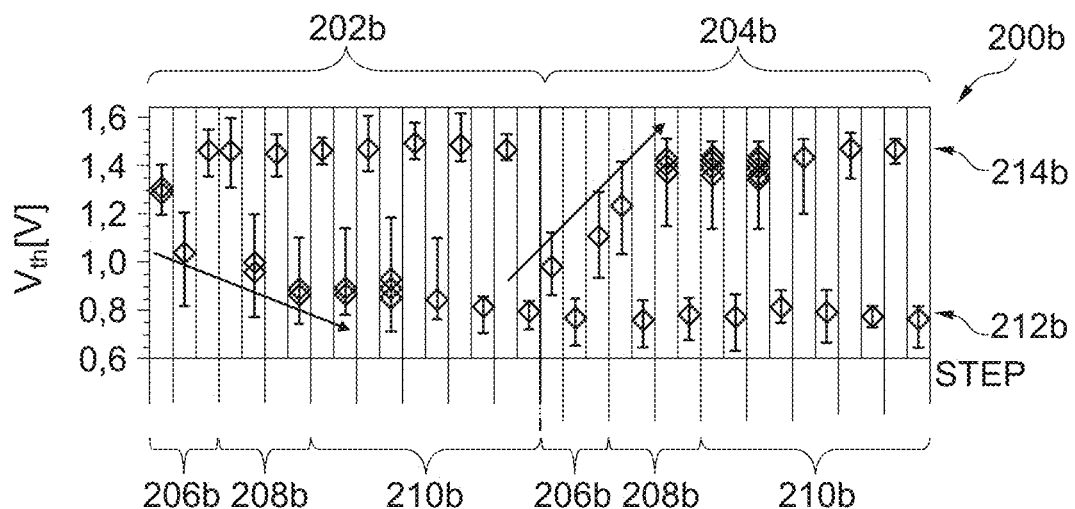

FIG. 2A and FIG. 2B each shows a respective graph 200a, 200b illustrating a threshold voltage distribution of memory cells (e.g., in a memory device). As an exemplary scenario, the graphs 200a, 200b may refer to memory cells including a FeCAP, e.g., with dimensions 135 nm×135 nm. The graphs 200a, 200b illustrate the impact of device-to-device variation on wake-up characteristics of memory cells. Illustratively, the graphs 200a, 200b show process-related variations in memory cells that are not subject to a preconditioning operation as described herein.

The graphs 200a, 200b show the evolution of the threshold voltage distribution over subsequent processing steps to which the memory cells are subjected (after having been formed). The processing steps may include initial cycling 206a, 206b, wake-up cycling 208a, 208b, and endurance testing 210a, 210b. The initial cycling 206a, 206b may include, for example, a first and a second cycling. The wake-up cycling 208a may include, as an example, ten wake-up cycles or, as another example, the wake-up cycling 208b may include a first wake-up cycle with a single cycle and a second wake-up cycle with ten wake-up cycles. The endurance testing 210a, 210b may include, as numerical examples, a first endurance test with a single cycle, a second endurance test with ten cycles, a third endurance test with one-hundred cycles, a fourth endurance test with one-thousand cycles, and a fifth endurance test with ten-thousand cycles.

As a numerical example, the memory cells may have a low threshold voltage, $V_{L-th}$, of 0.8 V (indicated with 212a, 212b in the graphs 200a, 200b), and a high threshold voltage, $V_{H-th}$, of 1.5 V (indicated with 214a, 214b in the graphs 200a, 200b).

The graph 200a in FIG. 2A shows the threshold voltage distribution of memory cells having a small coupling ratio (portion 202a of graph 200a), and of memory cells having a large coupling ratio (portion 204a of graph 200a). As numerical examples, the portion 202a may describe the threshold voltage distribution of memory cells having a field-effect transistor with length of 410 nm and width of 480 nm, and the portion 204a may describe the threshold voltage distribution of memory cells having a field-effect transistor with length of 100 nm and width of 1000 nm.

The graph 200a shows that, in particular for memory cells with a large coupling ratio, the value of the threshold voltage may vary greatly within the memory cells (of a same memory device), thus making it difficult to achieve uniform and reliable wake-up of the memory cells.

The graph 200b in FIG. 2B shows, as an exemplary configuration, the threshold voltage distribution of memory cells having a field-effect transistor with length of 520 nm and width of 610 nm. The portions 202b, 204b of the graph 200b refer to different batches of memory cells, illustratively to memory cells formed on a first wafer and a second wafer. The graph 200b shows that process variations (e.g., among different batches of memory cells) have an impact on the wake-up characteristics of the memory cells. In graph 200b, for example, the memory cells on the first wafer (portion 202b) show large variations in the low-threshold voltage over the subsequent processing steps, whereas the memory cells on the second wafer (portion 204b) show large variations in the high-threshold voltage over the subsequent processing steps. Therefore, the properties of memory cells in different batches may vary, e.g., in terms of threshold voltage and thus in terms of polarization switching capabilities. Such variations make it difficult to provide memory devices including memory cells with a reliable and reproducible switching behavior, thus reducing the overall quality of the memory device(s).

Various aspects may be based on the realization that an additional "preconditioning" operation may be introduced to influence the properties of a memory cell (e.g., the polarization properties of a spontaneously-polarizable memory element of the memory cell) to bring the memory cell in an operable (starting) condition that provides a more predictable behavior of the memory cell. The preconditioning operation described herein may provide achieving predefined polarization properties of the spontaneously-polarizable memory element, so that a more reliable and reproducible switching behavior may be provided.

In some aspects, the preconditioning operation described herein may include acting on a memory cell as a first action after the memory cell is formed (e.g., on a wafer), illustratively prior to any further testing (e.g., prior to cycling, wake-up, and endurance, as examples) or any further operation (e.g., prior to writing the memory cell). In some aspects, the preconditioning operation described herein may include acting on a memory cell as a preliminary action before the memory cell is put into operation, illustratively before the memory cell starts to be used for storing data (e.g., prior to a first writing operation of the memory cell).

The preconditioning operation described herein may be configured to act on the spontaneously-polarizable memory element of a memory cell in such a way that one or more polarization properties (or polarization-related properties) of the spontaneously-polarizable memory element are brought into an operable condition (e.g., assume a predefined value, show a predefined behavior, etc.). Illustratively, the preconditioning operation may influence the spontaneously-polarizable material of the memory element to provide one or more predefined polarization properties that allow an operation of the memory cell.

Figure 3:
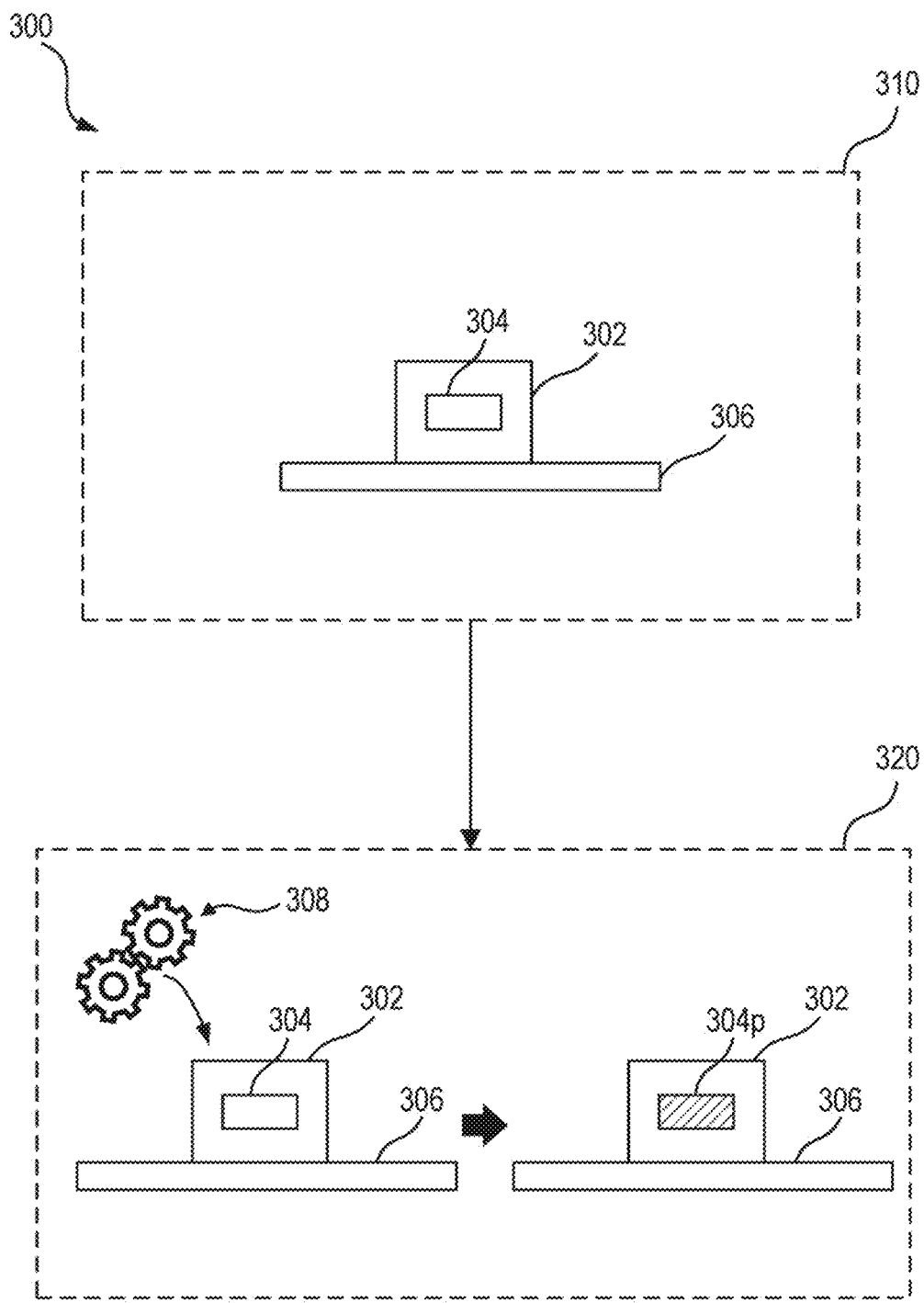
FIG. 3 shows a method of manufacturing a memory cell according to various aspects.

FIG. 3 shows a method 300 of manufacturing a memory cell 302 according to various aspects. The memory cell 302 may include a memory structure with a spontaneously-polarizable memory element 304. The memory cell 302 and the spontaneously-polarizable memory element 304 are represented in a schematic manner in FIG. 3. In various aspects, the memory cell 302 may include a memory structure configured as the memory structure 100 described in relation to FIG. 1A and FIG. 1B, with a field-effect transistor structure and a capacitive memory structure coupled to or integrated in the field-effect transistor structure. The method 300 may be understood as a method of making a memory cell 302 ready for use in such a way that a more solid and predictable behavior of the memory cell may be provided. In some aspects, the method 300 may be based on complementary metal-oxide-semiconductor technology.

In the following, the method 300 is described in relation to providing a (single) memory cell 302. It is however understood that the aspects of the method 300 may apply in a corresponding manner to a method of manufacturing a memory device including one or more memory cells 302. Illustratively, the method 300 may be understood, in some aspects, as a method of manufacturing a memory device including one or more memory cells 302, wherein at least one, or more than one, or all of the one or more memory cells 302 undergo a preconditioning operation as described below.

The method 300 may include, in 310, forming a memory cell 302 including a spontaneously-polarizable memory element 304. The memory cell 302 may be formed on a semiconductor substrate 306, e.g., on a semiconductor wafer (e.g., a silicon wafer, or other suitable semiconductor material to provide a channel region for a field-effect transistor structure of the memory cell 302, as described in relation to FIG. 1A and FIG. 1B). In various aspects, the semiconductor substrate 306 may include one or more dies, and forming 310 the memory cell 302 may include forming the memory cell 302 on a die of the semiconductor substrate 306. In relation to the manufacturing of a memory device, the method 300 may include forming one or more memory cells 302 on each of the one or more dies of the semiconductor substrate 306.

Forming 310 the memory cell 302 may include one or more layering and patterning processes for forming the memory cell 302, e.g., for forming the memory element 304 and/or the electrodes of the memory cell 302 (e.g., the electrodes of the field-effect transistor structure). In some aspects, a mask may be used. A mask may include a material that serves for transferring a photo-lithography mask pattern into one or more material layers. A mask may include, for example, a positive or negative photo resist (also referred to as soft mask) or a hard mask. The photo resist itself may be patterned by standard lithography processes. The patterning of the hard mask material may include a combination of photo resist patterning followed by etch of the hard mask material (e.g., wet or dry chemical etching). However, any other suitable process may be used to transfer a desired pattern into one or more material layers.

Forming an electrode may include depositing a plurality of electrode layers or growing a plurality of electrode layers. The deposition or the growth of an electrode layer may be carried out with technologies known in the art, for example by means of sputtering, electron beam evaporation, chemical vapor deposition, thermal vapor deposition, nucleation, and the like. In some aspects, the deposition or the growth of an electrode layer may be carried out in a vacuum chamber. During layer deposition (e.g., atomic layer deposition, ALD, chemical vapor deposition, CVD, physical vapor deposition, PVD, as examples), for example, layers of different stoichiometry may be incorporated at specific locations in the host material. Forming the spontaneously-polarizable memory element 304 may include depositing (or growing) an amorphous material that may exhibit spontaneously-polarizable properties in at least one state (e.g., in a crystalline state).

After forming 310 the memory cell 302, the memory cell 302 and the spontaneously-polarizable memory element 304 may be in an as formed condition. Illustratively, the as formed condition may be a (pristine) condition of the memory cell 302 and of the spontaneously-polarizable memory element 304 after being formed (e.g., on the substrate 306) and prior to further processing, e.g., may be the condition as immediately following the various processing steps (e.g., deposition, growth, layering, patterning, etc.) to form the memory cell 302 and the spontaneously-polarizable memory element 304. In the formed condition, the memory cell 302 and the spontaneously-polarizable memory element 304 may have one or more as formed properties, e.g., one or more as formed polarization properties, e.g., an as formed remanent polarization, as formed threshold voltage(s), an as formed memory window, etc.

The method 300 may further include, in 320, carrying out a preconditioning operation 308 of the spontaneously-polarizable memory element 304 to bring the spontaneously-polarizable memory element 304 from the as formed condition into an operable condition (e.g., to provide a preconditioned memory element 304p, illustrated with a striped pattern in FIG. 3). Bringing the spontaneously-polarizable memory element 304 into the operable condition may allow for a writing of the memory cell after the preconditioning operation is carried out. The operable condition may provide properties of the spontaneously-polarizable memory element 304 (and of the memory cell 302) that enable an improved writing of the memory cell 302. Illustratively, the method 300 may include carrying out a preconditioning operation 308 to bring one or more polarization properties of the spontaneously-polarizable memory element 304 (e.g., one or more properties of a material of the spontaneously-polarizable memory element) from an as formed condition (e.g., initial after fabrication) into an operable condition.

In the following, e.g., with relation to FIG. 4A to FIG. 5B, two possible approaches for a preconditioning operation (e.g., for the preconditioning operation 308) will be described, e.g., based on one or more voltage pulses (see FIG. 4A to FIG. 4I) and based on a temperature profile (see FIG. 5A and FIG. 5B). These strategies provide for an efficient implementation of the preconditioning operation 308, e.g., during sorting, e.g., prior to a first use of the memory cell 302. It is however understood that also other approaches that provide influencing the polarization properties of a spontaneously-polarizable memory element 304 may be provided.

According to various aspects, the operable condition of the spontaneously-polarizable memory element 304p may be associated with a (operable, e.g., predefined) magnitude of a remanent polarization of the spontaneously-polarizable memory element 304p. Illustratively, the preconditioning operation 308 may be configured to bring the remanent polarization of the spontaneously-polarizable memory element 304 from an as formed remanent polarization value into an operable (e.g., predefined) remanent polarization value. For example, the operable condition of the spontaneously-polarizable memory element 304p may be associated with a remanent polarization having a magnitude greater than the magnitude of the as formed remanent polarization. An increased magnitude of the remanent polarization (with respect to a "non-conditioned" memory cell, e.g., with respect to a pristine memory cell) may provide better defined polarization states, and accordingly better defined memory states of the memory cell 302.

According to various aspects, additionally or alternatively, the operable condition of the spontaneously-polarizable memory element 304p may be associated with a (operable, e.g., predefined) write voltage to bring the memory cell 302 into a memory state (e.g., a memory state of at least two memory states, e.g., the LVT and HVT states). Illustratively, the preconditioning operation 308 may be configured to influence the spontaneously-polarizable memory element 304 in such a way that a value of a write voltage to write the memory cell 302 goes from an as formed write voltage value to an operable write voltage value. For example, the operable condition of the spontaneously-polarizable memory element 304p may be associated with a write voltage having a voltage value less than the as formed write voltage value (e.g., 5% less, 10% less, or 20% less, as numerical examples). A reduced write voltage (with respect to a "non-conditioned" memory cell, e.g., with respect to a pristine memory cell) may ease the requirements to operate the memory cell 302, e.g., to operate a memory device including the memory cell 302, in terms of complexity and energy consumption.

According to various aspects, additionally or alternatively, the operable condition of the spontaneously-polarizable memory element 304p may be associated with a predefined switching behavior of a polarization of the spontaneously-polarizable memory element 304p. Illustratively, the preconditioning operation 308 may be configured to influence the spontaneously-polarizable memory element 304 in such a way that a polarization state of the spontaneously-polarizable memory element 304p may be switched in a predefined manner (e.g., from a first polarization state to a second polarization state). The predefined switching behavior may include, for example, a predefined switching time of the polarization state, a predefined coercive field to be provided at the spontaneously-polarizable memory element 304p, a predefined hysteresis behavior of the polarization, and/or the like. The predefined switching behavior may provide uniform switching properties of the memory cell 302 (and in some aspects of the memory cells of a memory device), thus ensuring a predictable operation.

According to various aspects, additionally or alternatively, the operable condition of the spontaneously-polarizable memory element 304p may be associated with a predefined threshold voltage of a field-effect transistor structure of the memory cell 302 (e.g., with a predefined first, e.g., low, and/or second, e.g., high, threshold voltage). As described in relation to FIG. 1A and FIG. 1B, the polarization state of the spontaneously-polarizable memory element 304 may influence the threshold voltage of the field-effect transistor structure (e.g., a first polarization state may be associated with a first threshold voltage, and a second polarization state may be associated with a second threshold voltage). The preconditioning operation 308 may be configured to bring the threshold voltage(s) of the field-effect transistor structure from an as formed threshold voltage value to an operable (predefined) threshold voltage value. For example, the low threshold voltage may be brought from an as formed low threshold voltage value to an operable low threshold voltage value, and/or the high threshold voltage may be brought from an as formed high threshold voltage value to an operable high threshold voltage value. In various aspects, the operable threshold voltage(s) may be greater than the as formed threshold voltage(s) (e.g., the operable low threshold voltage may be greater than the as formed low threshold voltage and/or the operable high threshold voltage may be greater than the as formed high threshold voltage). The threshold voltage(s) of the field-effect transistor structure having a (respective) predefined threshold voltage value (rather than a less predictable as formed threshold voltage value) allow for a more reliable writing and reading of the memory cell 302. The greater threshold voltage(s) (e.g., having greater voltage values) provide for a more defined writing and readout of the memory cell, thus reducing the risk of writing or reading the "wrong memory state".

In some aspects the operable condition of the spontaneously-polarizable memory element 304p may be associated with a(n) (operable) memory window of the memory cell 302. The threshold voltages $V_{L-th}$, $V_{H-th}$ of the field-effect transistor structure of the memory cell 302 may define its memory window. Illustratively, the memory window may define a range of gate-source voltages, $V_{GS}$, (e.g., a range of gate voltages, $V_G$, in the case that the source voltage, $V_S$, is 0 V), which may be provided at the memory cell 302 to determine its memory state. As an example, a readout voltage, VR, having a value falling between the first threshold voltage, $V_{L-th}$, and the second threshold voltage, $V_{H-th}$, (e.g., falling within the memory window) may be applied between the gate and the source of the memory cell 302. The preconditioning operation 308 may be configured to influence the spontaneously-polarizable memory element 304p in such a way that a memory window of the memory cell 302 has one or more predefined properties, e.g., a predefined width, a predefined voltage range, and the like. The memory window having one or more predefined properties (rather than less predictable as formed properties, such as a pristine width, a pristine position, etc.) may provide for a more reproducible operation of the memory cell 302, e.g., for a more reproducible readout. In various aspects, the operable memory window may have a greater width (may be wider) than the as formed memory window of the memory cell 302. A wider memory window may provide for a more defined writing and reading of the memory cell, as described in relation to the threshold voltages.

The preconditioning operation 308 may be carried out before the memory cell 302 is put into operation, e.g., prior to a (temporally first) writing operation of the memory cell 302. Illustratively, it may suffice to carry out the preconditioning operation 308 only once prior to putting the memory cell 302 in operation, e.g., only once during the lifetime of the memory cell 302. In various aspects, the preconditioning operation 308 may be carried out independently of a writing operation of the memory cell 302. Illustratively, the preconditioning operation 308 may be a preliminary operation to bring the memory cell 302 in a desired operable (initial) condition, which may be carried out independently of whether the memory cell 302 is about to be written. In some aspects, the preconditioning operation 308 may be carried out without the memory cell 302 being in any of its possible memory states (e.g., without the memory cell 302 being neither in the LVT state nor in the HVT state).

In various aspects, the preconditioning operation 308 may be carried out as part of the overall manufacturing process of the memory cell 302 (or memory device). The method 300 may include carrying out the preconditioning operation 308 after forming the memory cell 302 and prior to delivering the memory cell 302, e.g., prior to packaging the die including the memory cell 302 (illustratively, prior to packaging the die to provide a memory device). In various aspects, the preconditioning operation 308 may be a process carried out at wafer-level.

The method 300 may further include packaging the die including the memory cell 302 after carrying out the preconditioning operation 308 (e.g., packaging one or more dies including one or more memory cells 302), to provide a memory device (e.g., one or more memory devices). Packaging of the die including the memory cell 302 (e.g., wafer packaging) may include encapsulating the die, e.g., in an encapsulation structure that protects the die from external influences (e.g., corrosion, bumps, etc.). Carrying out the preconditioning operation 308 as part of the overall fabrication process of the memory cell 302 may provide delivering a product that is already in the desired operable condition, without the need for a customer to carry out the preconditioning or to wait for the preconditioning prior to the first use of the memory cell 302 or memory device.

In various aspects, the method 300 may include carrying out the preconditioning operation 308 at sorting (e.g., wafer sorting), e.g., the method 300 may include sorting the die including the memory cell 302 (or sorting the one or more dies including the one or more memory cells) during or prior to carrying out the preconditioning operation 308. Sorting in a manufacturing process may be an inspection of a product (e.g., of the die(s)) to identify whether the product is non-functional. Sorting may be carried out prior to packaging (e.g., prior to packaging the die), so that only functional products are packaged (and delivered to a customer). For example, sorting may be or may include electrically testing the product, e.g., with a prober, to determine whether the electrical connections of the product are functioning correctly.

The method 300 may optionally include additional processing of the memory cell 302 after the preconditioning operation 308, e.g., additional cycling or testing to characterize the memory cell 302 (or the one or more memory cells of a memory device). The preconditioning operation 308 may provide easing the requirements of such additional processing, e.g., reducing a voltage to be used in such additional processing.

According to various aspects, the method 300 may include, after the preconditioning operation 308, carrying out a wake-up cycle to wake up the spontaneously-polarizable memory element 304. A wake-up cycle may include providing one or more voltage drops over the spontaneously-polarizable memory element 304 to (further) increase the remanent polarization of the spontaneously-polarizable memory element 304. The previous preconditioning operation 308 may ensure that the wake-up cycling achieves the desired increase in the remanent polarization of the spontaneously-polarizable memory element 304. Illustratively, with respect to carrying out a wake-up cycle on a non-preconditioned spontaneously-polarizable memory element 304, the preconditioning operation 308 may ensure that the wake-up cycling may be carried out with uniform and reproducible parameters (e.g., with same voltage drops for different memory cells), and for example with a reduced wake-up voltage provided at the memory cell 302. In various aspects, the wake-up cycling may include more than one cycle (e.g., more than one voltage drop provided over the memory element 304p), for example two, three, four, five, ten, or more than ten wake-up cycles.

According to various aspects, the method 300 may include, after the preconditioning operation 308 (and after the wake-up cycling, if present), carrying out an endurance test of the memory cell 302. An endurance test may include testing the behavior of the memory cell 302 under expected operating conditions. For example, the endurance test may include carrying out one or more writing and/or one or more readout of the memory cell 302, to verify the stability of the operation of the memory cell. The endurance test may provide determining whether the memory cell 302 is expected to function correctly over time. The previous preconditioning operation 308 may ensure that the endurance test may be carried out with reduced voltages (e.g., reduced write voltages and/or reduced readout voltages)

with respect to an endurance test carried out on a memory cell with a non-preconditioned spontaneously-polarizable memory element 304. As an example, carrying out the endurance test may include providing one or more endurance voltage pulses at the memory cell 302 (to generate endurance voltage drops over the spontaneously-polarizable memory element 304p), and the preconditioning operation 308 may allow using endurance voltage pulses having a reduced amplitude and/or a reduced duration with respect to an endurance test carried out on a memory cell with a non-preconditioned spontaneously-polarizable memory element 304. In various aspects, the endurance test may include any suitable number of tests (e.g., a suitable number of cycles to write the memory cell 302 into its possible memory states, e.g., in the LVT state and in the HVT state), e.g., one, two, three, four, five, ten, one-hundred, one-thousand, ten-thousand, or even more than ten-thousand tests (or cycles).

In the following, with relation to FIG. 4A to FIG. 5B, possible strategies for a preconditioning operation 308 will be illustrated, which may provide for a simple and efficient implementation of the preconditioning operation 308 (e.g., may be readily implemented, for example by a control circuit as described in further detail in FIG. 7). It is however understood that other approaches for providing a preconditioning of the spontaneously-polarizable memory element of a memory cell may be provided. It is also understood that the aspects described in relation to FIG. 4A to FIG. 4I, and the aspects described in relation to FIG. 5A and FIG. 5B may be combined with one another.

FIG. 4A to FIG. 4I illustrate a preconditioning operation based on one or more voltage pulses, according to various aspects. The aspects described in relation to FIG. 4A to FIG. 4I may apply to the preconditioning operation 308 described in relation to FIG. 3. According to various aspects a preconditioning operation (e.g., the preconditioning operation 308) may include providing a precondition signal 402a, 402b, 402c, 402d, 402e, 402f, 402g, 402h, 402i at a memory cell to cause one or more preconditioning voltage drops over the spontaneous-polarizable memory element of the memory cell (e.g., over the spontaneous-polarizable memory element 304 of the memory cell 302). Illustratively, the precondition signal 402a-402i may be understood as any (e.g., constant or time-varying) potential or voltage at a gate and at least one source/drain of the memory cell defining a voltage drop over the spontaneously-polarizable element of the memory cell. As an example, the precondition signal 402a-402i may include a first precondition voltage at the gate and a second precondition voltage at the source/drain. The first precondition voltage may be constant and the second precondition voltage may be time-varying. As another example, both the first precondition voltage and the second precondition voltage may be time-varying.

According to various aspects, the precondition signal 402a-402i may include one or more precondition voltage pulses 404 provided at a spontaneously-polarizable memory element to modify one or more of its polarization properties (to provide one or more predefined polarization properties from one or more pristine polarization properties). In FIG. 4A to FIG. 4I possible configurations of a precondition signal 402a-402i (e.g., possible configurations of one or more precondition voltage pulses 404) are illustrated, which may provide suitable configurations for implementing a preconditioning operation; it is however understood that also other configurations of a precondition signal may be provided. In the following, various properties of precondition voltage pulses 404 will be described, which may be adapted to provide the preconditioning operation described herein (e.g., the desired preconditioning of the polarization properties of the spontaneously-polarizable memory element).

A precondition signal 402a-402i may be configured to provide a preconditioning voltage drop over the spontaneously-polarizable memory element different from (e.g., greater than) a write voltage drop for writing the memory cell. As an example, the preconditioning voltage drop may be greater than a voltage drop that would be used in a writing operation of the memory cell. For example, the preconditioning voltage drop may be greater than a voltage drop provided by an operating circuit associated with the memory cell (e.g., an operating circuit of the memory device or coupled with the memory device). The greater voltage drop provided in the preconditioning operation ensures the variation of the polarization properties of the memory element to bring the memory cell in the operable state.

A precondition voltage pulse 404 may have an amplitude, $A_p$, (also referred to as pulse height for a pulsed voltage). The amplitude, $A_p$, may be or may represent a maximum voltage value (or voltage level) associated with the precondition voltage pulse 404. In other words, the amplitude, $A_p$, may be or may represent the magnitude of a voltage level (e.g., a precondition voltage, $V_p$) associated with the precondition voltage pulse 404. Illustratively, the amplitude, $A_p$, may be or may represent a voltage level associated with the precondition voltage pulse 404 evaluated with respect to a reference voltage, $V_{ref}$, (e.g., a base voltage, $V_B$, of a memory cell or of a memory device). The amplitude, $A_p$, may also be referred to as peak amplitude. As a numerical example, a precondition voltage pulse 404 may have an amplitude, $A_p$, having an absolute value in a range from about 1 V to about 20 V, for example from about 2 V to about 10 V, for example from about 3 V to about 5 V. The amplitude, $A_p$, may be different from (e.g., greater than) the amplitude of a write voltage pulse to write the memory cell, e.g., may be different from (e.g., greater than) a voltage provided by an operating circuit associated with the memory cell. In various aspects, the amplitude, $A_p$, may be greater than the amplitude of an endurance voltage pulse for endurance testing of the memory cell. An operating circuit associated with a memory device may include, for example, a supply circuit to provide a supply voltage at a memory device.

A precondition voltage pulse 404 may have a rise time, $R_p$. The rise time, $R_p$, may be or may represent the amount of time the precondition voltage pulse 404 takes to go from the reference voltage, $V_{ref}$, to the precondition voltage, $V_p$. In various aspects, the rise time, $R_p$, may be or may represent the amount of time the precondition voltage pulse 404 takes to go from a voltage level equal to about 10% of the precondition voltage, $V_p$, to a voltage level equal to about 90% of the precondition voltage, $V_p$. As a numerical example, the rise time, $R_p$, may be in the range from about 1 ns to about 100 ns, for example from about 5 ns to about 50 ns.

A precondition voltage pulse 404 may have a fall time, $F_p$. The fall time, $F_p$, may be or may represent the amount of time the precondition voltage pulse 404 takes to go from precondition voltage, $V_p$, to the reference voltage, $V_{ref}$. In various aspects, the fall time, $F_p$, may be or may represent the amount of time the precondition voltage pulse 404 takes to go from a voltage level equal to about 90% of the precondition voltage, $V_p$, to a voltage level equal to about 10% of the precondition voltage, $V_p$. As a numerical example, the fall time, $F_p$, may be in the range from about 1 ns to about 100 ns, for example from about 5 ns to about 50 ns.

According to various aspects, the rise time, $R_p$, and the fall time, $F_p$, of the precondition voltage pulse 404 may have substantially the same value. In other aspects, the rise time, $R_p$, and the fall time, $F_p$, may also have different values. For example, it may take longer for the precondition voltage pulse 404 to go from the reference voltage $V_{ref}$ to the precondition voltage $V_p$ than for the precondition voltage pulse 404 to go from the precondition voltage, $V_p$, to the reference voltage, $V_{ref}$, or vice versa.

A precondition voltage pulse 404 may have a pulse width, $PW_p$, (also referred to as pulse length or duration). The pulse width, $PW_p$, may be or may represent the amount of time during which the amplitude, $A_p$, of the precondition voltage pulse 404 is at its maximum value (e.g., the amount of time the peak amplitude of the precondition voltage pulse 404 is at the precondition voltage level). As a numerical example, the precondition voltage pulse 404 may have a pulse width, $PW_p$, in the range from about 10 ns to about 2 ms, for example from about 100 ns to about 1500 ms, for example from about 500 ns to about 1 ms. According to various aspects, a total duration of a precondition voltage pulse 404 may be determined by the pulse width, $PW_p$, the rise time, $R_p$, and the fall time, $F_p$, of the precondition voltage pulse 404. In various aspects, the pulse width, $PW_p$, may be different from (e.g., greater than) the pulse width of a write voltage pulse to write the memory cell, e.g., may be different from (e.g., greater than) the pulse width of a voltage pulse provided by an operating circuit associated with the memory cell. In various aspects, the pulse width, $PW_p$, may be greater than the pulse width of an endurance voltage pulse for endurance testing of the memory cell.

As an exemplary configuration, in the case that the precondition signal 402a-402i includes only a single precondition voltage pulse 404, the pulse width, $PW_p$, of this single precondition voltage pulse 404 may be greater than a pulse width or total pulse duration of one or more write voltage pulses to write the memory cell. However, in the case that a plurality of precondition voltage pulses 404 is used, a total pulse duration of the plurality of precondition voltage pulses 404 may be greater than a pulse width or total pulse duration of one or more write voltage pulses to write the memory cell. A total pulse duration may be described, for example, as the sum of the individual pulse widths of the one or more precondition/write voltage pulses, or, for example, as the sum of the individual pulse widths, the individual rise times, and the individual fall times of the one or more precondition/write voltage pulses. However, in the case that a plurality of precondition voltage pulses 404 is used, each pulse width, $PW_p$, of these precondition voltage pulses 404 may be smaller than a pulse width or total pulse duration of one or more write voltage pulses.

As numerical examples, a pulse width or a total pulse duration of the one or more precondition voltage pulses 404 may be in the range from about 50 ns to about 100 ms, for example in the range from about 500 ns to about 1 ms, for example in the range from about 1 µs to about 500 µs. A pulse width or a total pulse duration of the one or more write voltage pulses may be in the range from about 5 ns to about 10 ms, for example from about 100 ns to about 1 µs.

According to various aspects, a precondition voltage pulse 404 may have a shape, and various shapes may be provided for a precondition voltage pulse 404, such as trapezoidal (see FIG. 4A and FIG. 4B), ramp (see FIG. 4C and FIG. 4D), DC-shape (see FIG. 4E and FIG. 4F, also referred to as DC stress, illustrated slightly shifted with respect to the reference voltage for the sake of representation), triangular (not shown), or std pulse (not shown), as examples. Different shapes may have different properties in terms of rise time, fall time, duration, etc., thus providing an adaptation of the preconditioning operation (e.g., to adapt the operation to the properties of the spontaneously-polarizable memory element, e.g., to the type of material, the thickness, etc.).

According to various aspects, the precondition signal 402a-402f may include a single precondition voltage pulse 404 (as shown for example in FIG. 4A to FIG. 4F). According to various aspects, the precondition voltage pulse 404 may have a positive amplitude, $A_p$, (as shown for example in FIGS. 4A, 4C, 4E) or a negative amplitude, $A_p$, (as shown for example in FIGS. 4B, 4D, 4F).

Figure 4A:
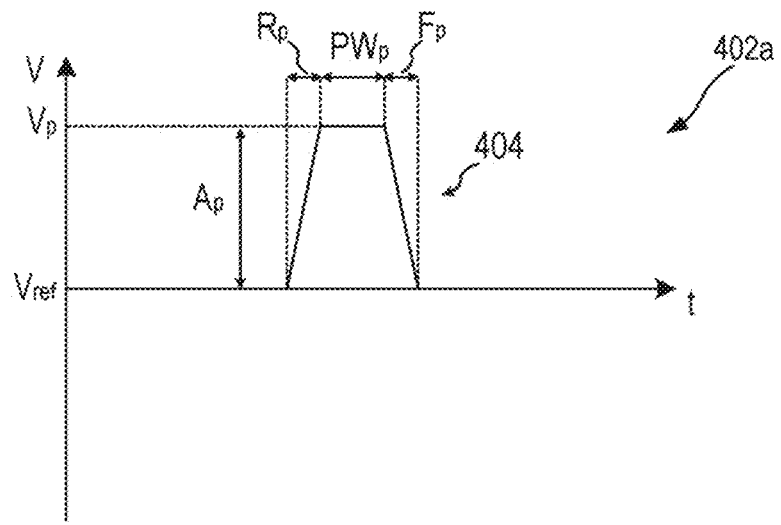
FIG. 4A to FIG. 4I show a preconditioning operation including one or more preconditioning voltage pulses according to various aspects.
Figure 4B:
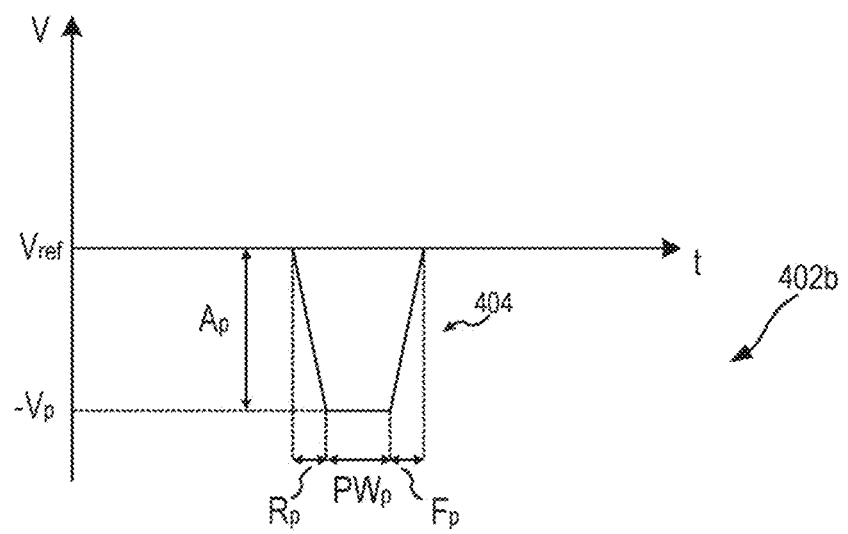
Figure 4C:
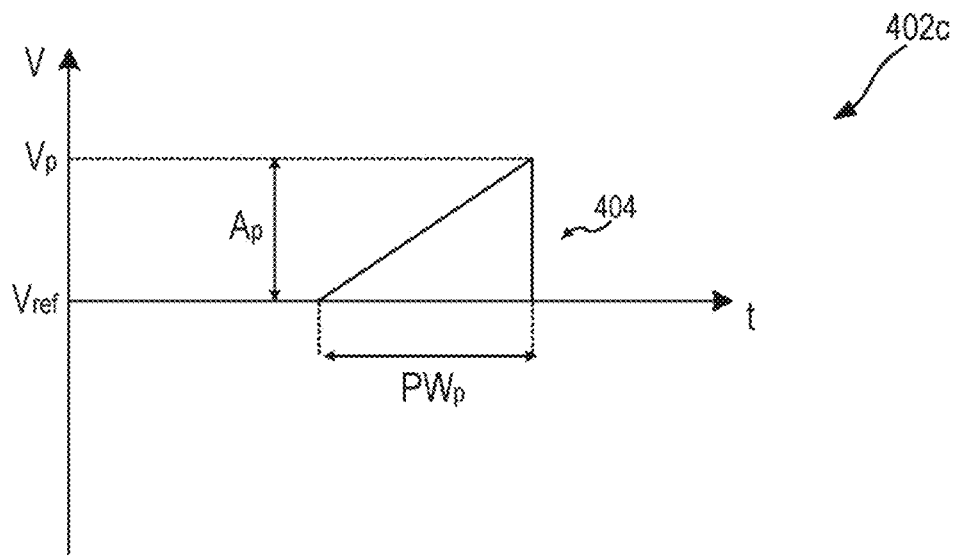
Figure 4D:
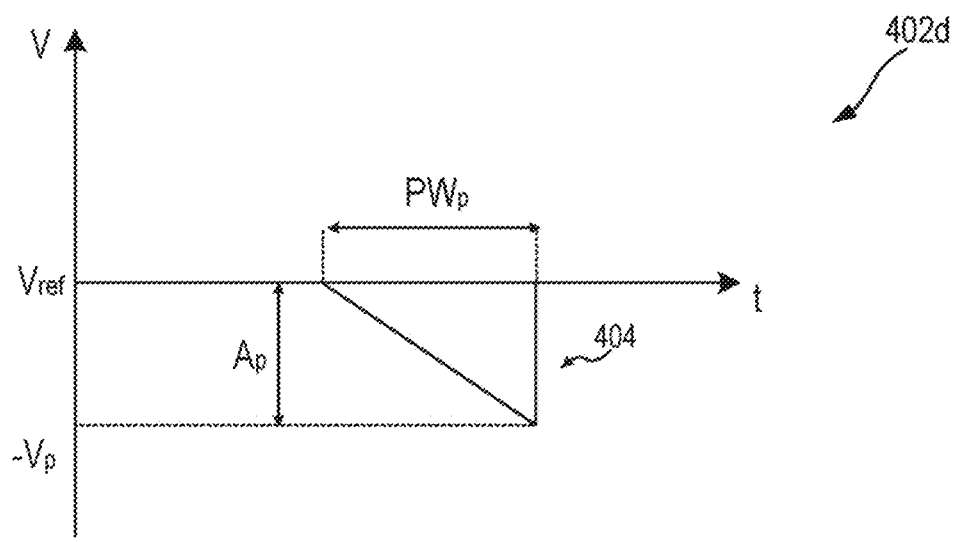
Figure 4E:
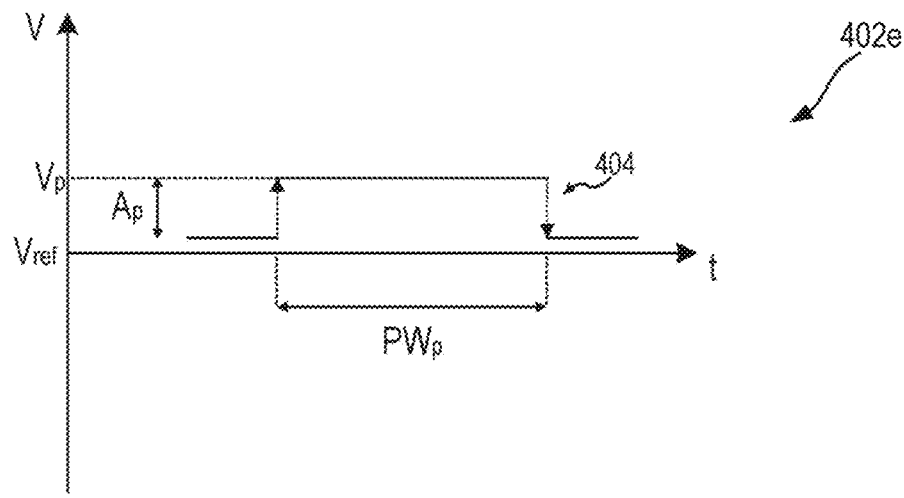
Figure 4F:
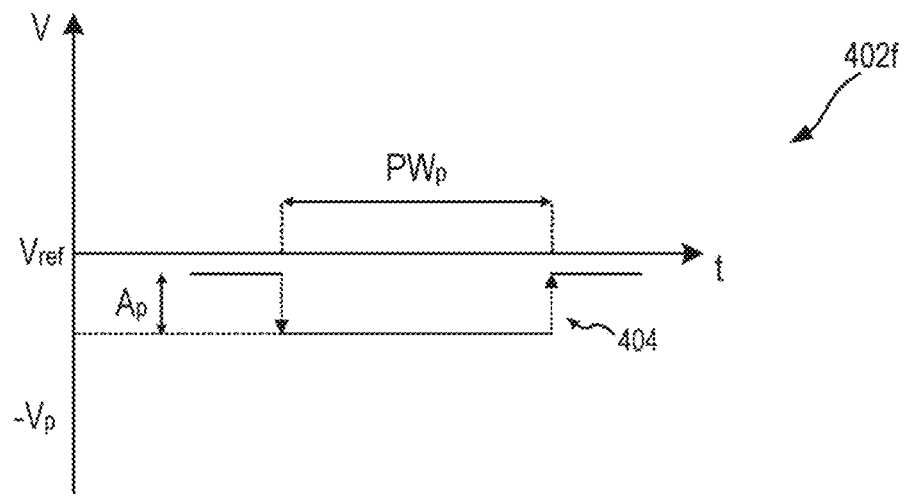
Figure 4G:
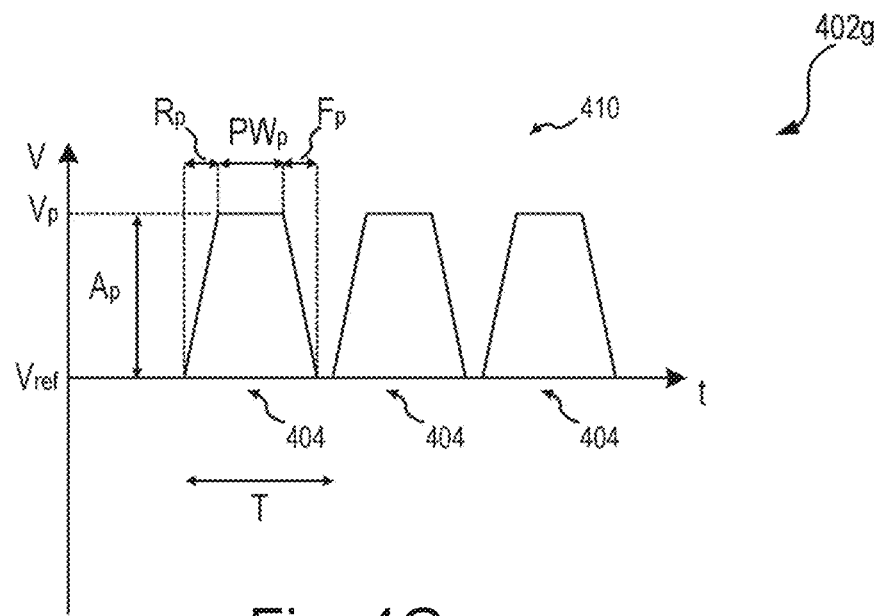
Figure 4H:
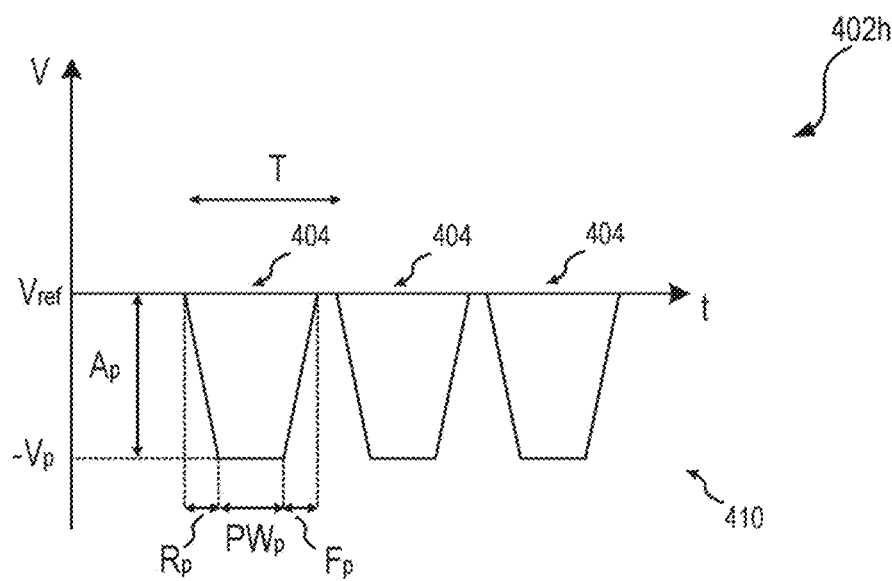
Figure 4I:
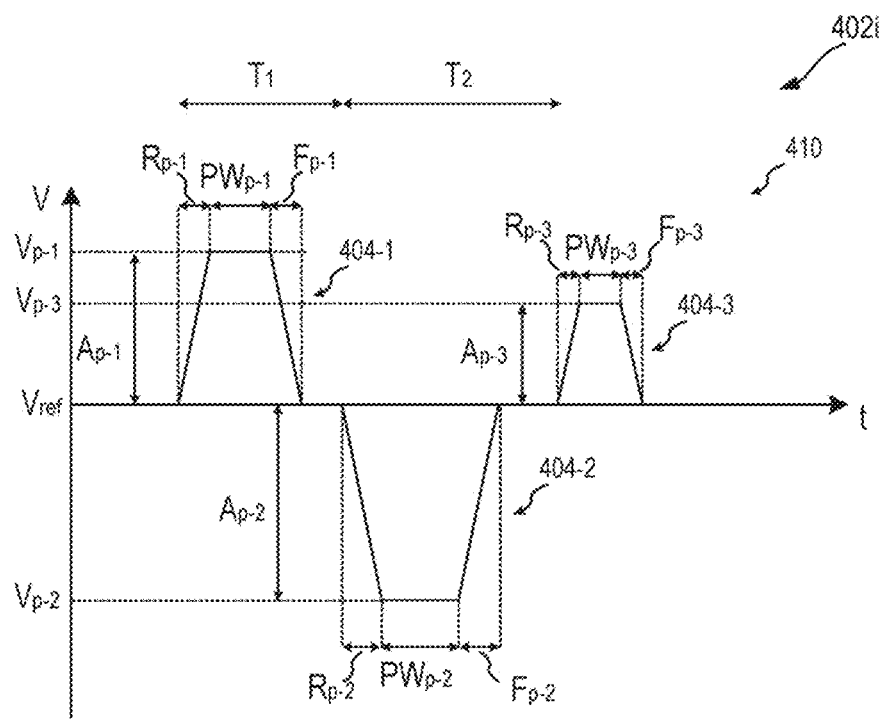

According to various aspects, the precondition signal 402g-402i may include a sequence (also referred to as a train) 410 of precondition voltage pulses 404 (as shown for example in FIG. 4G to FIG. 4I). Illustratively, the precondition signal 402g-402i may include a plurality of precondition voltage pulses 404. The precondition voltage pulses 404 of the sequence 410 of precondition voltage pulses 404 may be supplied to a memory cell (e.g., a memory cell to be preconditioned) one after the other during a preconditioning operation of the memory cell. As numerical example, the sequence 410 of precondition voltage pulses 404 may include a number of precondition voltage pulses 404 in a range from 2 to 10000, for example in a range from 2 to 1000, for example in a range from 2 to 200, for example in a range from 5 to 100, for example in a range from 10 to 50. The sequence 410 of precondition voltage pulses 404 is illustrated in FIG. 4G to FIG. 4I with trapezoidal voltage pulses, but it is understood that the aspects described in relation to the sequence 410 of trapezoidal voltage pulses may apply in a corresponding manner to precondition voltage pulses 404 having another shape.

The sequence 410 of precondition voltage pulses 404 may include precondition voltage pulses 404 each having a same polarity (illustratively, may be a sequence of unidirectional pulses), for example an amplitude, $A_p$, having the same sign (e.g., positive as shown for example in FIG. 4G, or negative as shown for example in FIG. 4H). According to various aspects, the sequence 410 of precondition voltage pulses 404 may include at least one precondition voltage pulse 404-1 having an amplitude, $A_p$, of opposite sign with respect to the amplitude, $A_p$, of another precondition voltage pulse 404-2 (as shown, for example, in FIG. 4I). Illustratively, the sequence 410 of precondition voltage pulses 404 may include at least one precondition voltage pulse 404-1 having opposite polarity with respect to another precondition voltage pulse 404-2 (may be a sequence of bi-directional pulses).

As an example, the precondition signal 402g-402i may include at least a first precondition voltage pulse 404 and a second precondition voltage pulse 404 applied at the gate of the memory cell and a constant base voltage, $V_B$, applied at the source or drain of the memory cell. The first precondition voltage pulse 404 may have opposite polarity with respect to the second precondition voltage pulse 404. In this configuration, a first voltage drop and a second voltage drop may be generated over the spontaneously-polarizable memory element of the memory cell (by applying the first and the second precondition voltage pulses 404). The first voltage drop may have opposite polarity with respect to the second voltage drop.

As another example, the precondition signal 402g-402i may include at least a first precondition voltage pulse 404 and a second precondition voltage pulse 404 applied at the source or drain of the memory cell and a constant base voltage, $V_B$, applied at the gate of the memory cell. The first precondition voltage pulse 404 may have opposite polarity with respect to the second precondition voltage pulse 404. Also in this configuration, a first voltage drop and a second voltage drop with opposite polarity may be generated over the remanent-polarizable layer of the memory cell. Illustratively, the precondition signal may include a first precondition signal portion configured to generate a (first) voltage drop over the spontaneous-polarizable memory element with a first polarity and a second precondition signal portion configured to generate a (second) voltage drop over the spontaneous-polarizable memory element with a second polarity opposite the first polarity.

However, it may also be possible to apply a time-varying precondition voltage (e.g., a sequence 410 of precondition voltage pulses 404) at both the gate and the source or drain of the memory cell to generate the desired voltage drop over the spontaneously-polarizable memory element (e.g., to generate a first voltage and a second voltage drop with opposite polarity).

According to various aspects, the precondition voltage pulses 404 of the sequence 410 of precondition voltage pulses 404 may all have substantially the same amplitude, $A_p$, (as shown, for example, in FIG. 4G and FIG. 4H). According to other aspects, at least one precondition voltage pulse 404-1 may have a different amplitude, $A_{p-1}$, (e.g., higher or lower, for example in terms of absolute value), with respect to another precondition voltage pulse 404-2 (as shown, for example, in FIG. 4I). In the exemplary case shown in FIG. 4I, a first precondition voltage pulse 404-1 may have a first amplitude, $A_{p-1}$, (e.g., associated with a first precondition voltage, $V_{p-1}$), which may be higher (e.g., greater in terms of absolute value) than a second amplitude, $A_{p-2}$, (e.g., associated with a second precondition voltage, $V_{p-2}$) of a second precondition voltage pulse 404-2. The first amplitude, $A_{p-1}$, may be higher (e.g., it may have a greater absolute value, for example it may be more negative) than a third amplitude, $A_{p-3}$, (e.g., associated with a third precondition voltage, $V_{p-3}$) of a third precondition voltage pulse 404-3.

The same considerations may apply correspondingly to the rise time $R_{p-1}, R_{p-2}, R_{p-3}$, the fall time $F_{p-1}, F_{p-2}, F_{p-3}$, and the pulse width $PW_{p-1}, PW_{p-2}, PW_{p-3}$, of the voltage pulses 404-1, 404-2, 404-3, which may be substantially equal to one another, or may vary (e.g., be longer or shorter) among the voltage pulses 404-1, 404-2, 404-3.

According to various aspects, the sequence 410 of precondition voltage pulses 404 may have a period, T. The period, T, may be or may represent a period of time between two neighboring precondition voltage pulses 404 in the sequence 410. As an example, the period, T, may be or may represent a period of time between the beginning of the rise time, $R_p$, of a first precondition voltage pulse 404, and the beginning of the rise time, $R_p$, of a second precondition voltage pulse 404, adjacent in the sequence 410 and subsequent to the first precondition voltage pulse 404. As a numerical example, the period, T, of the sequence 410 of precondition voltage pulses 404 may be in the range from about 20 ns to about 400 ns, for example from about 50 ns to about 200 ns. According to various aspects, the period, T, of the sequence 410 of precondition voltage pulses 404 may remain constant over time (as shown, for example in FIG. 4G and FIG. 4H). According to other aspects, the period, T, of the sequence 410 of precondition voltage pulses 404 may vary over time (as shown for example in FIG. 4O. As an example, in a first portion of the sequence 410 of precondition voltage pulses 404, the period may have a first value, $T_1$, and in a second portion of the sequence 410 the period may have a second value, $T_2$, different (e.g., longer or shorter) from the first value.

The sequence 410 of precondition voltage pulses 404 may be configured such that a precondition voltage pulse 404 has opposite polarity with respect to the adjacent precondition voltage pulse(s) 404 in the sequence 410 (e.g., to its nearest neighboring precondition voltage pulse(s) 404 in the sequence 410). Illustratively, a precondition voltage pulse 404 having a positive amplitude may be followed by a precondition voltage pulse 404 having a negative amplitude, which may be followed by another precondition voltage pulse 404 having a positive amplitude, etc. According to various aspects, the sequence 410 of precondition voltage pulses 404 may be configured such that a first set (e.g., one or more) of precondition voltage pulses 404 all having the same polarity is followed by a second set (e.g., one or more) of precondition voltage pulses 404 all having opposite polarity with respect to the precondition voltage pulses 404 of the first set. In some aspects, the number of precondition voltage pulses 404 in the first set of precondition voltage pulses 404 may be the same as the number of precondition voltage pulses 404 in the second set of precondition voltage pulses 404. In other aspects, the number of precondition voltage pulses 404 in the first set of precondition voltage pulses 404 may be different from the number of precondition voltage pulses 404 in the second set.

The preconditioning of the spontaneously-polarizable element may allow using lower voltages for subsequent processing of a memory cell, e.g., using lower voltages for endurance testing of the memory cell (and/or for wake-up). The predefined (and more uniform) polarization properties provided by the preconditioning operation, e.g., the increased remanent polarization of the spontaneously-polarizable memory element, allow using a lower voltage for switching the polarization of the memory element. The preconditioning may thus be carried out with different cycling condition compared to what is used during endurance (and/or wake-up), thus bringing down voltage requirements for endurance (and/or wake-up). The maximum voltage level used in a preconditioning operation may thus be greater than a maximum voltage level used in endurance testing.

As an additional or alternative approach for carrying out a preconditioning operation (e.g., the preconditioning operation 308), the spontaneously-polarizable memory element to be preconditioned may be brought at a temperature that causes a variation in one or more of its polarization properties to vary them from a respective as formed condition into the operable condition. The temperature-based strategy may be implemented individually or in combination with the voltage-based strategy described in relation to FIG. 4A to FIG. 4I, e.g., the temperature of the spontaneously-polarizable memory element may be varied while one or more precondition voltage pulses are provided at the spontaneously-polarizable memory element.

Figure 5A:
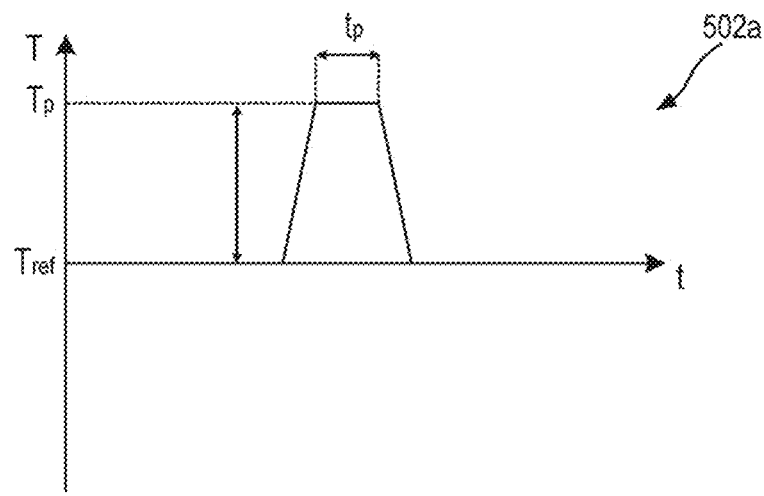
FIG. 5A and FIG. 5B show a preconditioning operation including a preconditioning temperature cycle according to various aspects.
Figure 5B:
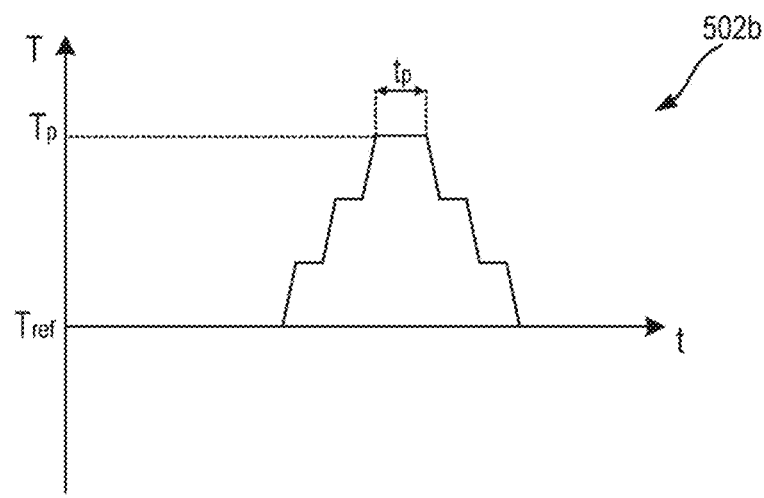

FIG. 5A and FIG. 5B illustrate a preconditioning operation based on one or more temperature cycles, according to various aspects. The aspects described in relation to FIG. 5A and FIG. 5B may apply to the preconditioning operation 308 described in relation to FIG. 3. According to various aspects carrying out a preconditioning operation (e.g., the preconditioning operation 308) may include bringing a temperature of a memory cell (illustratively, the spontaneously-polarizable memory element) at a predefined temperature, e.g., at a temperature value in a predefined temperature range. Illustratively, various aspects may be based on the realization that in a preconditioning temperature range (e.g., above a preconditioning temperature threshold), one or more polarization properties of a spontaneously-polarizable memory element vary and may thus be brought from an as formed condition into an operable (predefined) condition.

In FIG. 5A and FIG. 5B possible configurations of a temperature cycle 502a, 502b are illustrated, which may provide suitable configurations for implementing a preconditioning operation; it is however understood that also other configurations of a temperature cycle may be provided. In the following, various properties of a temperature cycle will be described, which may be adapted to provide the preconditioning operation described herein (e.g., the desired preconditioning of the polarization properties of the spontaneously-polarizable memory element). The graphs in FIG. 5A and FIG. 5B show a temperature variation with respect to a reference temperature $T_{ref}$, which may be, for example, 0° C.

According to various aspects, a preconditioning operation may include bringing the temperature of the memory cell at a preconditioning temperature greater than a temperature of the memory cell during its (expected) operation (e.g., during writing or reading of the memory cell), also referred to herein as operating temperature of the memory cell. Illustratively, the preconditioning temperature may be greater than the temperature the memory cell reaches when operated under normal operating conditions, e.g., when data are written into or read from the memory cell in a normal operation. Further illustratively, a memory cell during its operation may not reach a temperature that could cause variations in the properties of the memory element, whereas in the preconditioning operation the temperature of the memory cell may be purposefully increased to impart one or more predefined polarization properties to the spontaneously-polarizable memory element. As a numerical example, the preconditioning temperature may be greater than 50° C., for example greater than 100° C. or greater than 200° C., for example may be in the range from 50° C. to 150° C., for example in the range from 75° C. to 100° C., for example the predefined temperature may be 85° C. As another example, the preconditioning temperature may be at least 1.5 times greater than the operating temperature, for example at least two times greater, for example at least three times greater.

Various temperature cycles may be provided to bring the memory cell at the preconditioning temperature. In the exemplary configurations illustrated in FIG. 5A the temperature of the memory cell may be ramped up (and down) without intermediate steps (as shown in the temperature cycle 502a), and may be maintained at the preconditioning temperature, $T_p$, for a period of time to induce the variation in the polarization properties of the memory element. As a numerical example, the memory cell may be maintained at a temperature in the preconditioning temperature range for a predefined period of time, $t_p$, in the range from 10 ms to 10 min, for example in the range from 100 ms to 1 min. The ramp-up and ramp-down times may be adapted based on the properties of the spontaneously-polarizable memory element (e.g., the material, the thickness, etc.).

In the exemplary configurations illustrated in FIG. 5B the temperature of the memory cell may be ramped up (and down) in a series of subsequent steps (as shown in the temperature cycle 502b), and may be maintained at the preconditioning temperature, $T_p$, for the predefined period of time, $t_p$, to induce the variation in the polarization properties of the memory element. The number of steps, and the individual ramp-up and ramp-down times may be adapted based on the properties of the spontaneously-polarizable memory element.

Figure 6A:
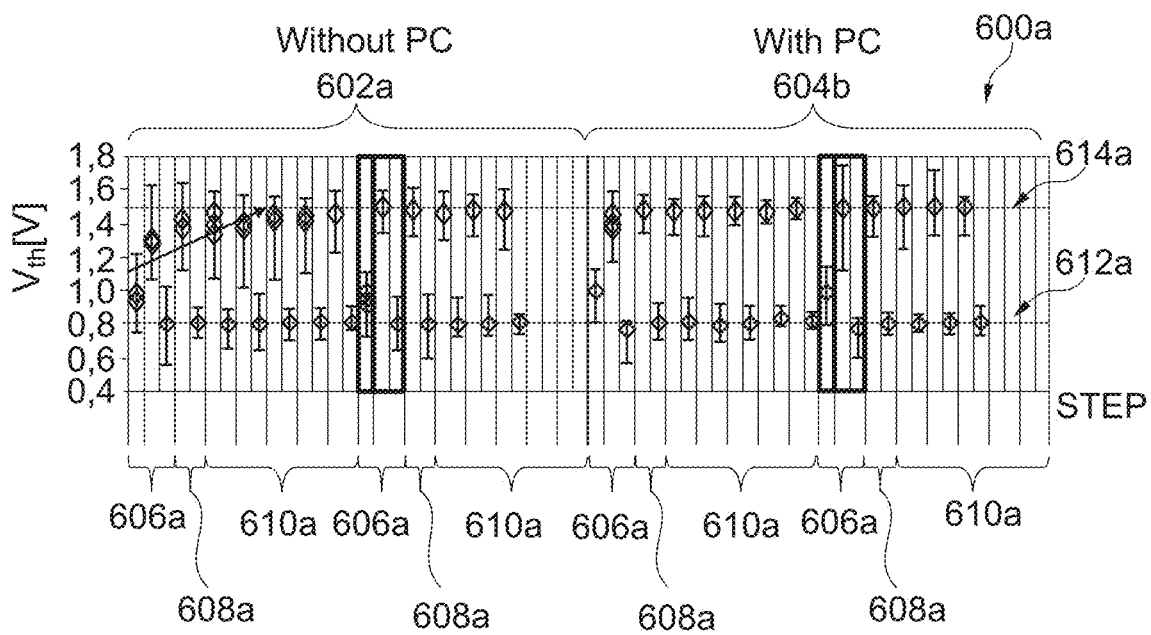
FIG. 6A and FIG. 6B show the impact of a preconditioning operation on the properties of a memory cell according to various aspects.
Figure 6B:
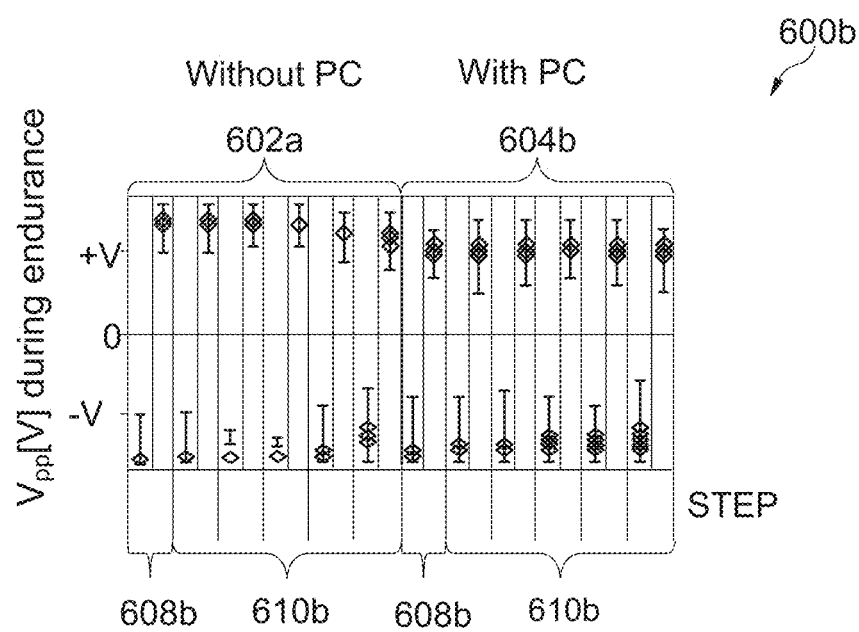

The effects of a preconditioning operation as described herein will be illustrated in further detail in relation to FIG. 6A and FIG. 6B.

FIG. 6A and FIG. 6B show respective graphs 600a, 600b illustrating the impact of a preconditioning operation on the properties of a memory cell according to various aspects. The graph 600a shows the evolution of the threshold voltage distribution over subsequent processing steps to which non-preconditioned memory cells (portion 602a) and preconditioned memory cells (portions 604a) are subjected to. The graph 600b shows the distribution of the voltage used during endurance for non-preconditioned memory cells (portion 602b) and preconditioned memory cells (portions 604b).

The processing steps shown in graphs 600a, 600b include initial cycling 606a, wake-up cycling 608a, 608b, and endurance testing 610a, 610b. The initial cycling 606a may include, for example, a first and a second cycling. The wake-up cycling 608a, 608b may include, as an example, ten wake-up cycles. The endurance testing 610a, 610b may include, as numerical examples, a first endurance test with a single cycle, a second endurance test with ten cycles, a third endurance test with one-hundred cycles, a fourth endurance test with one-thousand cycles, and a fifth endurance test with ten-thousand cycles.

As a numerical example, the memory cells may have a low threshold voltage, $V_{L-th}$, of 0.8 V (indicated with 612a in the graph 600a), and a high threshold voltage, $V_{H-th}$, of 1.5 V (indicated with 614a in the graph 600a). The graphs 600a, 600b may describe the threshold voltage distribution of memory cells having a field-effect transistor with length of 100 nm and width of 1000 nm.

The graph 600a illustrates that the implementation of the preconditioning operation provides that the memory window of the memory cells is very solid during cycling and endurance. This may be true also for memory cells with small coupling ratios, and for memory cells including a ferroelectric material with high wake-up requirements. Illustratively, the preconditioned memory cells (portion 604a) exhibit a more stable and reproducible polarization behavior, e.g., a more uniform threshold voltage distribution, with respect to the non-preconditioned memory cells (portion 602a).

The graph 600b illustrates that the implementation of the preconditioning operation provides that a reduced voltage (illustratively, a reduced write voltage, e.g., $V_{PP}$) may be used for endurance testing of preconditioned memory cells (portion 604b) with respect to non-preconditioned memory cells (portion 602b). The implementation of a preconditioning operation (e.g., one time, for example at sorting) may thus reduce the write voltage requirements during endurance cycling. In graph 600b, for example, the write voltage used for non-preconditioned memory cells may be about 7.5 V, whereas for preconditioned memory cells may be about 5 V. The preconditioning operation described herein allows thus reducing the complexity and the resource-consumption of the endurance testing.

In the following, in relation to FIG. 7 a memory device adapted to implement the preconditioning strategy described herein will be illustrated.

Figure 7:
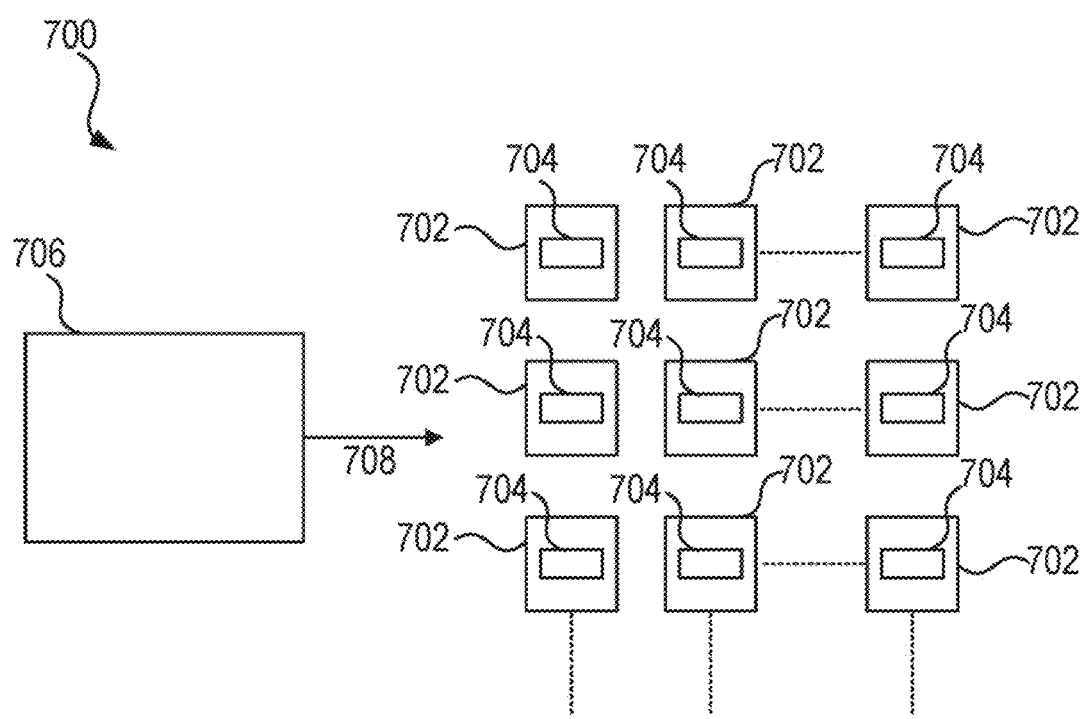
FIG. 7 shows schematically a memory device including a memory controller configured to cause a preconditioning operation according to various aspects.

FIG. 7 shows a memory device 700 in a schematic view according to various aspects. The memory device 700 may include one or more memory cells 702, e.g., disposed on a semiconductor substrate, such as on a semiconductor wafer. For example, the one or more memory cells 702 may be disposed on a die of the semiconductor substrate (e.g., the semiconductor substrate may include one or more dies, each including one or more memory cells 702). The one or more memory cells 702 may include a memory structure with a spontaneously-polarizable memory element 704. The memory cell 702 and the spontaneously-polarizable memory element 704 are represented in a schematic manner in FIG. 7. In various aspects, the memory cells 702 may include a memory structure configured as the memory structure 100 described in relation to FIG. 1A and FIG. 1B, with a field-effect transistor structure and a capacitive memory structure coupled to or integrated in the field-effect transistor structure. In the simplified representation in FIG. 7, nine memory cells 702 (disposed in three columns and three rows) are shown. It is however understood that the memory device 700 may include any number of memory cells 702 (e.g., to implement a desired storage size). In various aspects, the memory device 700 may be or may include a memory cell arrangement, with a matrix disposition of memory cells in a number n of rows and a number m of columns.

According to various aspects, at least one memory cell 702 of the one or more memory cells 702 may have undergone a preconditioning operation (e.g., the preconditioning operation 308 described in relation to FIG. 3) configured to bring the spontaneously-polarizable memory element 704 of the at least one memory cell 702 from an as formed condition into an operable condition. Illustratively, the spontaneously-polarizable memory element 704 of the at least one memory cell 702 may have one or more operable (predefined) polarization properties different from its as formed polarization properties. This may be evaluated, for example, comparing the behavior of the one or more memory cells 702 with the behavior of one or more other memory cells that did not undergo a preconditioning operation and verify whether there is a difference, for example in the magnitude of the remanent polarization, in the write voltage for writing the memory cells, etc. The at least one memory cell 702 may have undergone the preconditioning operation prior to packaging (e.g., at sorting), e.g., in some aspects the memory device 700 may be not packaged (or not yet packaged).

According to various aspects, the memory device 700 may include a control circuit 706 (a memory controller) configured to cause the preconditioning operation (e.g., the preconditioning operation 308 described in relation to FIG. 3) on at least one memory cell 702 of the one or more memory cells 702 (or on some, or on each memory cell 702 of the one or more memory cells 702). The control circuit 706 may be (pre)configured to cause the preconditioning operation at or prior to a first use of the memory device 700 (e.g., prior to a first use of the at least one memory cell 702). Illustratively, the memory device 700 may be provided (e.g., to a customer) without the memory cells 702 having been preconditioned during the overall manufacturing process, and the implementation of the preconditioning operation may be assigned to the control circuit 706 (e.g., after packaging, and after delivery).

The control circuit 706 may be (pre)configured to cause the preconditioning operation at any suitable time point prior to the first use of the memory device 700. As an example, the control circuit 706 may be (pre)configured to cause the preconditioning operation upon the first powering of the memory device. As another example, the control circuit 706 may be (pre)configured to cause the preconditioning operation in response to the first received writing instructions to write data into the memory cell(s) 702. The control circuit 706 may be (pre)configured to cause the preconditioning operation independently of a writing operation of the at least one memory cell 702. Illustratively, the control circuit 706 may be (pre)configured to cause the preconditioning operation independently of whether the memory cell(s) 702 are about to be written. The decoupling of the preconditioning from the writing of the memory cell(s) 702 may allow making the memory cell(s) 702 ready in the operable condition at a convenient time point (e.g., when the memory device 700 is powered but not being used), so that the operation of the memory device 700 is not slowed down.

The control circuit 706 may be (pre)configured to cause the preconditioning operation only once, e.g., only once over the lifetime of the memory device 700. In some aspects, the control circuit 706 may be configured or instructed to cause a further preconditioning operation, e.g., in the case that a malfunction or a non-desired operation of the memory device 700 is detected, e.g., at predefined time points (e.g., after one year of lifetime of the memory device, or after three years of lifetime of the memory device, as examples).

Various implementations may be provided for causing the preconditioning operation, as discussed above in relation to the preconditioning operation 308 (and in relation to FIG. 4A to FIG. 5B). The control circuit 706 may be configured to supply a precondition signal 708 to the memory cells 702 of the memory device 700 to cause a preconditioning of at least one of the one or more of the memory cells 702. As an example, the control circuit 706 may include or may control one or more voltage supply circuits. The one or more voltage supply circuits may be used for supplying voltages (e.g., precondition voltages, e.g., precondition voltage pulses) to control-lines of the memory device 700 (not shown in FIG. 3), e.g., for supplying voltages to respective control nodes of the memory cells 702 (not shown in FIG. 3). In various aspects, the control circuit 706 may include or may control one or more charge pumps to supply the voltages at the memory cells 702, which may provide using a voltage for the preconditioning having a different (e.g., greater) voltage value compared to a write voltage of a writing operation of the memory cells 702 (e.g., compared to endurance). The control circuit 706 may be configured to provide a preconditioning voltage drop over the spontaneously-polarizable memory element 704 of at least one memory cell 702 (e.g., over the spontaneously-polarizable memory element 704 of each memory cell 702), which may be different from (e.g., greater than) a write voltage drop for writing the memory cell(s) 702. In various aspects, the one or more voltage supply circuits may be configured to provide a voltage having a maximum value defined by the writing operation of the memory cell(s), e.g., denoted as $V_{PP}$ or $V_{DD}$. The control circuit 706 may be configured to provide a preconditioning voltage drop having a value (also referred to as amplitude) different from a possible value defined by the writing voltage (e.g., defined by $V_{PP}$ or $V_{DD}$), for example greater than a possible value defined by the writing voltage. As an exemplary configuration, as described above, the control circuit 706 may include or control an additional supply circuit (e.g., a charge pump) to provide the preconditioning voltage drop. According to various aspects, the control circuit 706 may define a base voltage, $V_B$, e.g., a ground voltage (for example 0 V) associated with the memory device 700 (the base voltage, $V_B$, may also be referred to herein as reference voltage, $V_{ref}$).

In various aspects, the control circuit 706 may include or may control one or more heat sources, e.g., one or more metal heaters, to bring a temperature of the memory cell(s) 702 at a preconditioning temperature (e.g., in a preconditioning temperature range) to cause the preconditioning operation. Illustratively, the memory device 700 may include one or more heat sources disposed in such a way that the heat generated by the one or more heat sources may vary (e.g., increase) the temperature of the one or more memory cells 702 (e.g., the temperature of the spontaneously-polarizable memory element(s) 704). The control circuit 706 may be configured to control the one or more heat sources according to a desired temperature profile, e.g., as described in relation to FIG. 5A and FIG. 5B.

In the following, various examples are provided that may refer to the memory cell 302, 702, memory device 700, and method 300 of providing a memory cell described above.

Example 1 is a method of manufacturing a memory cell, the method including: forming a memory cell (e.g., on a semiconductor substrate, e.g., on a die), wherein the memory cell includes a spontaneously-polarizable memory element, wherein the spontaneously-polarizable memory element is in an as formed condition; and carrying out a preconditioning operation of the spontaneously-polarizable memory element to bring the spontaneously-polarizable memory element from the as formed condition into an operable condition to allow for a writing of the memory cell after the preconditioning operation is carried out.

In Example 2, the method according to example 1 may optionally further include that the operable condition of the spontaneously-polarizable memory element is associated with a magnitude of a remanent polarization of the spontaneously-polarizable memory element greater than a magnitude of an as formed remanent polarization of the spontaneously-polarizable memory element.

In Example 3, the method according to example 1 or 2 may optionally further include that the operable condition of the spontaneously-polarizable memory element is associated with a write voltage to bring the memory cell into a memory state having a voltage value lower than a voltage value of an as formed write voltage to bring the memory cell into the memory state.

In Example 4, the method according to any one of examples 1 to 3 may optionally further include that the operable condition of the spontaneously-polarizable memory element is associated with a memory window of the memory cell wider than an as formed memory window of the memory cell.

In Example 5, the method according to any one of examples 1 to 4 may optionally further include that the memory cell further includes a field-effect transistor structure, and that the operable condition of the spontaneously-polarizable memory element is associated with a threshold voltage of the field-effect transistor structure greater than an as formed threshold voltage of the field-effect transistor structure.

In Example 6, the method according to any one of examples 1 to 5 may optionally further include that the operable condition of the spontaneously-polarizable memory element is associated with a memory window of the memory cell wider than an as formed memory window of the memory cell.

In Example 7, the method according to any one of examples 1 to 6 may optionally further include that the as formed condition of the spontaneously-polarizable memory element includes a condition of the spontaneously-polarizable memory element after the memory cell has been formed (e.g., on the semiconductor substrate).

In Example 8, the method according to any one of examples 1 to 7 may optionally further include that carrying out the preconditioning operation includes bringing a temperature of the memory cell at a preconditioning temperature (illustratively, at a temperature value in a predefined temperature range).

In Example 9, the method according to example 8 may optionally further include that the preconditioning temperature is greater than a temperature of the memory cell during its operation (e.g., during writing of the memory cell), e.g., greater than an operating temperature of the memory cell.

In Example 10, the method according to example 8 or 9 may optionally further include that the preconditioning temperature is greater than 50° C., for example greater than 100° C. or greater than 200° C., for example in the range from 50° C. to 150° C., for example in the range from 75° C. to 100° C., for example 85° C.

In Example 11, the method according to any one of examples 1 to 10 may optionally further include that carrying out the preconditioning operation includes providing a precondition signal at the memory cell to cause one or more precondition voltage drops over the spontaneous-polarizable memory element of the memory cell.

In Example 12, the method according to example 11 may optionally further include that the precondition signal includes one or more precondition voltage pulses.

A voltage value of an amplitude of the one or more precondition voltage pulses may be different from (e.g., greater than) a voltage value of an operating voltage for operating the memory cell (e.g., greater than a voltage value of a write voltage of the memory cell).

In Example 13, the method according to example 11 or 12 may optionally further include that the precondition signal includes at least a first precondition voltage pulse and at least a second precondition voltage pulse, and that the first precondition voltage pulse has opposite polarity with respect to the second precondition voltage pulse.

In Example 14, the method according to any one of examples 10 to 13 may optionally further include that the precondition signal includes a first precondition signal portion configured to generate a voltage drop over the spontaneous-polarizable memory element with a first polarity and a second precondition signal portion configured to generate a voltage drop over the spontaneous-polarizable memory element with a second polarity opposite the first polarity.

In Example 15, the method according to example 12 may optionally further include that at least one of the one or more precondition voltage pulses includes a pulse height having an absolute value in the range from about 0.5 V to about 25 V, and/or a pulse width in the range from about 0.5 ns to about 2 ms, and/or a rise time in the range from about 0.1 ns to about 100 ns, and/or a fall time in the range from about 0.1 ns to about 100 ns.

In Example 16, the method according to example 12 may optionally further include that the one or more precondition voltage pulses are supplied as a sequence of precondition voltage pulses, for example including a number of precondition voltage pulses in the range from 2 to 10000.

In Example 17, the method according to example 16 may optionally further include that the voltage pulses of the sequence of precondition voltage pulses are provided with a pulse period in the range from about 1 ns to about 1 ms.

In Example 18, the method according to any one of examples 1 to 17 may optionally further include, after carrying out the preconditioning operation, carrying out a wake-up cycle to wake up the spontaneously-polarizable memory element.

In Example 19, the method according to any one of examples 1 to 18 may optionally further include, after carrying out the preconditioning operation, carrying out an endurance test of the memory cell.

In Example 20, the method according to example 19 may optionally further include that carrying out the endurance test includes providing one or more endurance voltage pulses at the memory cell, and that a sum of the respective pulse width of the one or more endurance voltage pulses is less than a sum of the respective pulse width of the one or more precondition voltage pulses.

In Example 21, the method according to any one of examples 1 to 20 may optionally further include that forming the memory cell includes forming the memory cell on a die of a semiconductor substrate, and that the method further includes packaging the die including the preconditioned memory cell after the preconditioning operation is carried out.

In Example 22, the method according to any one of examples 1 to 21 may optionally further include, during or prior to carrying out the preconditioning operation, carrying out sorting of the memory cell (e.g., of the die on which the memory cell is formed). Illustratively, carrying out (wafer) sorting after forming the memory cell (and prior to further operations on the memory cell).

In Example 23, the method according to any one of examples 1 to 22 may optionally further include that the preconditioning operation is carried out prior to a first write operation of the memory cell.

In Example 24, the method according to any one of examples 1 to 23 may optionally further include that the spontaneously-polarizable memory element is or includes a spontaneously-polarizable layer.

In Example 25, the method according to example 24 may optionally further include that the spontaneously-polarizable memory element includes or consists of a spontaneous-polarizable material.

In Example 26, the method according to example 25 may optionally further include that the spontaneous-polarizable material includes a remanent-polarizable material (e.g., a ferroelectric material or an anti-ferroelectric material).

Example 27 is a method of manufacturing one or more memory devices, the method including: providing a semiconductor substrate that includes one or more dies, each of the one or more dies including a plurality of memory cells, each of the one or more memory cells including a spontaneously-polarizable memory element, and preconditioning the plurality of memory cells of each of the one or more dies to bring each of the plurality of memory cells into an operable condition defined by an operable condition (also referred to herein as preconditioned state) of the spontaneously-polarizable memory element of each of the plurality of memory cells, and packaging the one or more dies to provide one or more memory devices.

In Example 28, the method according to example 27 may optionally further include one or more features of the method according to any one of examples 1 to 26.

Example 29 is a method of manufacturing a memory cell, the method including: forming a memory cell, wherein the memory cell includes a spontaneously-polarizable memory element, wherein the spontaneously-polarizable memory element is in an as formed condition; and bringing a temperature of the memory cell at a preconditioning temperature greater than an operating temperature of the memory cell and/or providing a preconditioning voltage drop over the spontaneously-polarizable memory element, the preconditioning voltage drop being different from (e.g., greater than) a write voltage drop for writing the memory cell.

In Example 30, the method according to example 29 may optionally further include one or more features of the method according to any one of examples 1 to 28.

Example 31 is a memory device including: one or more memory cells, wherein each memory cell of the one or more memory cells includes a spontaneously-polarizable memory element, wherein at least one memory cell of the one or more memory cells has undergone a preconditioning operation configured to bring the spontaneously-polarizable memory element of the at least one memory cell from an as formed condition into an operable condition.

In Example 32, the memory device according to example 31 may optionally further include that the at least one memory cell has undergone the preconditioning operation at sorting.

In Example 33, the memory device according to example 31 or 32 may optionally further include that the memory device is not packaged.

In Example 34, the memory device according to any one of examples 31 to 33 may optionally further include one or more features of the methods according to any one of examples 1 to 30, where appropriate.

Example 35 is a memory device including: one or more memory cells, wherein each memory cell of the one or more memory cells includes a spontaneously-polarizable memory element; and a control circuit configured to cause a preconditioning operation of each spontaneously-polarizable memory element of the one or more memory cells to bring each spontaneously-polarizable memory element from an as formed condition into an operable condition to allow for a writing of the memory cell, wherein to cause the preconditioning operation the control circuit is configured to: provide a preconditioning voltage drop over each spontaneously-polarizable memory element, the preconditioning voltage drop being different from (e.g., greater than) a write voltage drop for writing the one or more memory cells, and/or bring a temperature of the one or more memory cells at a preconditioning temperature greater than an operating temperature of the one or more memory cells.

In Example 36, the method according to example 35 may optionally further include that the control circuit is (pre)configured to cause the preconditioning operation only once.

In Example 37, the method according to example 35 or 36 may optionally further include that the control circuit is (pre)configured to cause the preconditioning operation independently of a writing operation of the at least one memory cell.

In Example 38, the memory device according to any one of examples 35 to 37 may optionally further include one or more features of the methods according to any one of examples 1 to 30, where appropriate, and/or of the memory device according to any one of examples 31 to 33.

Example 39 is a computer program product including instructions to cause the control circuit of the memory device according to example 35 to execute the steps of the method of example 1.

Example 40 is a non-transitory computer readable medium including instructions to cause the control circuit of the memory device according to example 35 to execute the steps of the method of example 1.

Several aspects are described with reference to a structure (e.g., a memory transistor structure, e.g., a field-effect transistor structure, e.g., a ferroelectric field-effect transistor structure, e.g., a capacitive memory structure) and it is noted that such a structure may include solely the respective element (e.g., a memory transistor, e.g., a field-effect transistor, e.g., a ferroelectric field-effect transistor, e.g., a capacitive memory); or, in other aspects, a structure may include the respective element and one or more additional elements.

The term "voltage" may be used herein with respect to "one or more write voltages", "one or more precondition voltages", "one or more readout voltages", "one or more gate voltages", "a base voltage", "one or more source/drain voltages", "one or more word-line voltages", and the like. As an example, the term "gate voltage" may be used herein to denote a voltage that is provided to a gate node or a gate terminal of a field-effect transistor or a memory cell, as examples. As another example, the term "base voltage" may be used herein to denote a reference voltage and/or a reference potential for a circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "source/drain voltage" may be used herein to denote a voltage that is provided to a source/drain node or a source/drain terminal of a transistor or a memory cell, as examples. As another example, the term "control-line voltage" may be used herein to denote a voltage that is provided to a control-line, e.g., of a memory cell arrangement (for example a "word-line voltage" may be provided to a "word-line", a "bit-line voltage" may be provided to a bit-line, and a "source-line voltage" may be provided to a source-line).

Illustratively, a voltage provided to anode may assume any suitable value depending on the intended operation of the circuit including the node. For example, a gate voltage (referred to as $V_G$) may be varied depending on the intended operation of a field-effect transistor or a memory cell. Analogously, a source voltage (referred to as $V_S$) and/or a drain voltage (referred to as VD) may be varied depending on the intended operation of a field-effect transistor or a memory cell. A voltage provided to a node may be defined by the respective potential applied to that node relative to the base voltage (referred to as $V_S$) of the circuit. Further, a voltage drop associated with two distinct nodes of a circuit may be defined by the respective voltages/potentials applied at the two nodes. As an example, a gate-source voltage drop associated with a gate structure (e.g., of a field-effect transistor or a memory cell) may be defined by the respective voltages/potentials applied at the corresponding gate node and source node of the gate structure. The gate-source voltage drop may also be referred to as gate-source voltage, $V_{GS}$. In the case that the source voltage is zero, as used for example in conventional driving schemes for writing and/or reading of a field-effect transistor based memory cell, the gate-source voltage drop and the gate-source voltage, $V_{GS}$, may be referred to as gate voltage, $V_G$.

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison. As an example, an n-type or p-type field effect transistor (FET) based memory cell (e.g., having a spontaneously-polarizable memory element 124) may have a first (e.g., low) threshold voltage, $V_{L-th}$, and a second (e.g., high) threshold voltage, $V_{H-th}$. In the case of the n-type field-effect transistor (n-FET) based memory cell, the high threshold voltage, $V_{H-th}$, may be greater than the low threshold voltage, $V_{L-th}$, both with respect to the voltage value and the absolute voltage value (e.g., the $V_{L-th}$ may be 1 V and the $V_{H-th}$ may be 3 V, only as numerical examples), or the high threshold voltage, $V_{H-th}$, may be greater than the low threshold voltage, $V_{L-th}$, only with respect to the voltage value (e.g., the $V_{L-th}$ may be 1 V and the $V_{H-th}$ may be 1 V, or the $V_{L-th}$ may be 2 V and the $V_{H-th}$ may be 0 V, or the $V_{L-th}$ may be 3 V and the $V_{H-th}$ may be 1 V, only as numerical examples). In the case of the p-type field-effect transistor (p-FET) based memory cell, the high threshold voltage, $V_{H-th}$, may be lower than the low threshold voltage, $V_{L-th}$, with respect to the voltage value and higher than the low threshold voltage, $V_{L-th}$, with respect to the absolute voltage value (e.g., the $V_{L-th}$ may be 1 V and the $V_{H-th}$ may be 3 V, only as numerical examples), or the high threshold voltage, $V_{H-th}$, may be lower than the low threshold voltage, $V_{L-th}$, only with respect to the voltage value (e.g., the $V_{L-th}$ may be 1 V and the $V_{H-th}$ may be 1 V, or the $V_{L-th}$ may be 2 V and the $V_{H-th}$ may be 0 V, or the $V_{L-th}$ may be 3 V and the $V_{H-th}$ may be 1 V, only as numerical examples).

The term "switch" may be used herein to describe a modification of the memory state a memory cell is residing in. For example, in the case that a memory cell is residing in a first memory state (e.g., the LVT state), the memory state the memory cell is residing in may be switched such that, after the switch, the memory cell may reside in a second memory state (e.g., the HVT state), different from the first memory state. The term "switch" may thus be used herein to describe a modification of the memory state a memory cell is residing in, from a first memory state to a second memory state. The term "switch" may also be used herein to describe a modification of a polarization, for example of a spontaneously-polarizable memory element (e.g., of a spontaneously-polarizable layer, such as a remanent-polarizable layer). For example, a polarization of a spontaneously-polarizable memory element may be switched, such that the sign of the polarization varies from positive to negative or from negative to positive, while the absolute value of the polarization may remain in some aspects substantially unaltered. According to various aspects, writing a memory cell may include bringing the memory cell from one of at least two memory states into another one of the at least two memory states of the memory cell (e.g., from the LVT state into the HVT state, or vice versa).

The term "condition" may be used herein to include, for example, one or more properties, e.g., of a memory cell. As an example, a memory cell may be in a first condition and may have a first set of properties (e.g., a first value for the low and/or high threshold voltage, a first QV characteristic, and the like) associated therewith, and a memory cell may be in a second condition and may have a second set of properties (e.g., a second value for the low and/or high threshold voltage, a second QV characteristic, and the like) associated therewith. In this case, at least one property of the second set of properties may be different from that property in the first set of properties.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "coupled to" used herein with reference to functional parts of a memory cell (e.g., functional parts of a memory structure) that are coupled to respective nodes (e.g., source-line node, bit-line node, and/or word-line node) of the memory cell may be understood as follows: the respective functional parts are electrically conductively connected to corresponding nodes and/or the respective functional parts itself provide the corresponding nodes. As an example, a source/drain node of a field-effect transistor memory structure may be electrically conductively connected to the source-line node of the memory cell or the source/drain node of the field-effect transistor memory structure may provide the source-line node of the memory cell. As another example, a source/drain node of the field-effect transistor memory structure may be electrically conductively connected to the bit-line node of the memory cell or the source/drain node of the field-effect transistor memory structure may provide the bit-line node of the memory cell.

The term "metal material" may be used herein to describe a metal (e.g., a pure or substantially pure metal), a mixture of more than one metal, a metal alloy, an intermetallic material, a conductive metal compound (e.g., a nitride), and the like. Illustratively, the term "metal material" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band.

The terms "electrically conducting" or "electrically conductive" may be used herein interchangeably to describe a material or a layer having an electrical conductivity or an average electrical conductivity greater than $10^6$ S/m at a temperature of 20° C. The term "electrically insulating" may be used herein interchangeably to describe a material or a layer having an electrical conductivity or an average electrical conductivity less than $10^{-10}$ S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least $10^{15}$ S/m at a temperature of 20° C.

The term "region" used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.,). In some aspects, the continuous region of a semiconductor portion may be provided by semiconductor material having only one dominant doping type.

According to various aspects, various properties (e.g., physical properties, chemical properties, etc.) of a first component (e.g., elements, layers, structures, portions, etc.) and a second component may be compared to one another. It may be found that two or more components may be—with reference to a specific property—either equal to each other or different from one another. As a measure, a value that represents such a property may be either equal or not. In general, a skilled person may understand from the context of the application whether two values or properties are equal or not, e.g., usually, if values are in the range of a usual tolerance, they may be regarded equal. However, in some aspects or as long as not otherwise mentioned or understood, two values that differ from one another with at least 1% relative difference may be considered different from one another. Accordingly, two values that differ from one another with less than 1% relative difference may be considered equal to each other.

It may be understood that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance".

The terms "at least one" and "one or more" may be understood to include any integer number greater than or equal to one, i.e., one, two, three, four, [ . . . ], etc. The term "a plurality" or "a multiplicity" may be understood to include any integer number greater than or equal to two, i.e., two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A method of manufacturing a memory cell, the method comprising:
   forming a memory cell, wherein the memory cell comprises a spontaneously-polarizable memory element, wherein the spontaneously-polarizable memory element is in an as formed condition,
   wherein the as formed condition is a condition of the spontaneously-polarizable memory element after forming the spontaneously-polarizable memory element and prior to any cycling operation of the memory cell; and
   carrying out a preconditioning operation of the spontaneously-polarizable memory element to bring the spontaneously-polarizable memory element from the as-formed condition into an operable condition to allow for a writing of the memory cell after the preconditioning operation is carried out.

2. The method according to claim 1,
   wherein the operable condition of the spontaneously-polarizable memory element is associated with a magnitude of a remanent polarization of the spontaneously-polarizable memory element greater than a magnitude of an as formed remanent polarization of the spontaneously-polarizable memory element,
   wherein the as formed remanent polarization of the spontaneously-polarizable memory element is a remanent polarization of the spontaneously-polarizable memory element after forming the spontaneously-polarizable memory element and prior to any cycling operation of the memory cell.

3. The method according to claim 1,
wherein the operable condition of the spontaneously-polarizable memory element is associated with a write voltage to bring the memory cell into a memory state having a voltage value lower than a voltage value of an as formed write voltage to bring the memory cell into the memory state,
wherein the as formed write voltage is a write voltage of the memory cell after forming the memory cell and prior to any cycling operation of the memory cell.

4. The method according to claim 1,
wherein the operable condition of the spontaneously-polarizable memory element is associated with a memory window of the memory cell wider than an as formed memory window of the memory cell,
wherein the as formed memory window of the memory cell is a memory window of the memory cell after forming the memory cell and prior to any cycling operation of the memory cell.

5. The method according to claim 1,
wherein the memory cell further comprises a field-effect transistor structure,
wherein the operable condition of the spontaneously-polarizable memory element is associated with a threshold voltage of the field-effect transistor structure greater than an as formed threshold voltage of the field-effect transistor structure, and
wherein the as formed threshold voltage of the field-effect transistor structure is a threshold voltage of the field-effect transistor structure after forming the memory cell and prior to any cycling operation of the memory cell.

6. The method according to claim 1,
wherein carrying out the preconditioning operation comprises bringing a temperature of the memory cell at a preconditioning temperature greater than an operating temperature of the memory cell.

7. The method according to claim 6,
wherein the preconditioning temperature is greater than 50° C.

8. The method according to claim 1,
wherein carrying out the preconditioning operation comprises providing a precondition signal at the memory cell to cause one or more precondition voltage drops over the spontaneous-polarizable memory element of the memory cell.

9. The method according to claim 8,
wherein the precondition signal comprises one or more precondition voltage pulses, and
wherein a voltage value of an amplitude of the one or more precondition voltage pulses is different from a voltage value of an operating voltage for operating the memory cell.

10. The method according to claim 9,
wherein the precondition signal comprises at least a first precondition voltage pulse and at least a second precondition voltage pulse,
wherein the first precondition voltage pulse has opposite polarity with respect to the second precondition voltage pulse.

11. The method according to claim 8,
wherein the precondition signal comprises a first precondition signal portion configured to generate a voltage drop over the spontaneous-polarizable memory element with a first polarity and a second precondition signal portion configured to generate a voltage drop over the spontaneous-polarizable memory element with a second polarity opposite the first polarity.

12. The method according to claim 9,
wherein at least one of the one or more precondition voltage pulses comprises a pulse height having an absolute value in the range from about 0.5 V to about 25 V, and/or a pulse width in the range from about 0.5 ns to about 2 ms, and/or a rise time in the range from about 0.1 ns to about 100 ns, and/or a fall time in the range from about 0.1 ns to about 100 ns.

13. The method according to claim 1,
wherein forming the memory cell comprises forming the memory cell on a die of a semiconductor substrate, and
wherein the method further comprises packaging the die comprising the preconditioned memory cell after the preconditioning operation is carried out.

14. The method according to claim 1,
wherein the spontaneously-polarizable memory element comprises or consists of a ferroelectric material or anti-ferroelectric material.

15. A method of manufacturing one or more memory devices, the method comprising:
providing a semiconductor substrate that comprises one or more dies, each of the one or more dies comprising a plurality of memory cells, each of the plurality of memory cells comprising a spontaneously-polarizable memory element, and
preconditioning the plurality of memory cells of each of the one or more dies to bring each of the plurality of memory cells into an operable condition defined by a preconditioned state of the spontaneously-polarizable memory element of each of the plurality of memory cells, and
packaging the one or more dies to provide one or more memory devices.

16. The method according to claim 15,
wherein preconditioning the plurality of memory cells of each of the one or more dies comprises causing a precondition voltage drop over the spontaneous-polarizable memory elements of the plurality of memory cells,
wherein the precondition voltage drop is different from a write voltage drop for writing the plurality of memory cells.

17. The method according to claim 15,
wherein preconditioning the plurality of memory cells of each of the one or more dies comprises bringing a temperature of the plurality of memory cells at a preconditioning temperature greater than an operating temperature of the plurality of memory cells.

18. The method according to claim 17,
wherein the preconditioning temperature is greater than 50° C.

19. Memory device comprising:
one or more memory cells, wherein each memory cell of the one or more memory cells comprises a spontaneously-polarizable memory element; and
a control circuit configured to cause a preconditioning operation of each spontaneously-polarizable memory element of the one or more memory cells to bring each spontaneously-polarizable memory element from an as formed condition into an operable condition to allow for a writing of the memory cell,
wherein the as formed condition is a condition of the spontaneously-polarizable memory element after forming the spontaneously-polarizable memory element and prior to any cycling operation of the memory cell,
wherein to cause the preconditioning operation the control circuit is configured to:

provide a preconditioning voltage drop over each spontaneously-polarizable memory element, the preconditioning voltage drop being different from a write voltage drop for writing the one or more memory cells, and/or bring a temperature of the one or more memory cells at a preconditioning temperature greater than an operating temperature of the one or more memory cells.

20. The memory device according to claim 19, wherein the control circuit is configured to cause the preconditioning operation independently of a writing operation of the one or more memory cells.

* * * * *